United States Patent
Ogawa et al.

(10) Patent No.: US 8,866,829 B2
(45) Date of Patent: Oct. 21, 2014

(54) INTEGRATED CIRCUIT DEVICE AND ELECTRONIC EQUIPMENT

(75) Inventors: Hideki Ogawa, Suwa-gun (JP); Yoshiro Iwasa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 812 days.

(21) Appl. No.: 12/845,983

(22) Filed: Jul. 29, 2010

(65) Prior Publication Data

US 2011/0032263 A1 Feb. 10, 2011

(30) Foreign Application Priority Data

Aug. 5, 2009 (JP) ................. 2009-182209

(51) Int. Cl.
*G06T 1/60* (2006.01)
*G11C 5/02* (2006.01)
*H01L 23/00* (2006.01)
*G09G 5/39* (2006.01)
*G09G 5/393* (2006.01)
*G09G 5/395* (2006.01)

(52) U.S. Cl.
CPC .............. *G09G 5/39* (2013.01); *G09G 5/393* (2013.01); *H01L 2924/01006* (2013.01); *G09G 5/395* (2013.01); *H01L 2924/01019* (2013.01); *H01L 2924/01061* (2013.01); *G11C 5/02* (2013.01); *H01L 24/49* (2013.01); *H01L 2924/01055* (2013.01); *H01L 2924/01005* (2013.01); *H01L 2924/01056* (2013.01); *H01L 2924/01033* (2013.01); *G09G 2360/18* (2013.01); *H01L 2224/48227* (2013.01); *H01L 2224/49171* (2013.01); *H01L 2924/01082* (2013.01); *H01L 2224/48145* (2013.01)
USPC ........................................ 345/530

(58) Field of Classification Search
CPC combination set(s) only.
See application file for complete search history.

(56) References Cited

U.S. PATENT DOCUMENTS

| 6,492,727 | B2 * | 12/2002 | Nishizawa et al. | 257/723 |
|---|---|---|---|---|
| 7,061,785 | B2 * | 6/2006 | Miwa et al. | 365/63 |
| 2004/0145042 | A1 * | 7/2004 | Morita et al. | 257/692 |
| 2005/0161794 | A1 * | 7/2005 | Kato et al. | 257/686 |
| 2007/0007650 | A1 * | 1/2007 | Tsukiji | 257/737 |
| 2009/0152709 | A1 * | 6/2009 | Shinohara | 257/690 |

FOREIGN PATENT DOCUMENTS

| JP | A-61-212033 | 9/1986 |
|---|---|---|
| JP | A-2000-91729 | 3/2000 |

* cited by examiner

*Primary Examiner* — James A Thompson
(74) *Attorney, Agent, or Firm* — Oliff PLC

(57) ABSTRACT

An integrated circuit device includes: a first pad to an ith pad connected to a first memory pad to an ith memory pad of a memory stacked in the integrated circuit device; a jth pad to a kth pad connected to a jth memory pad to a kth ($1<i<j<k$) memory pad of the memory; and at least one pad arranged between the ith pad and the jth pad, wherein the at least one pad is not connected to a memory pad of the memory and serves as a pad for input or output a signal between an external device and the integrated circuit device.

16 Claims, 17 Drawing Sheets

IN PRODUCTION

INSTRUCTION CODE INFORMATION

| COMMAND | INSTRUCTION |
|---|---|
| CMA | INSA1<br>INSA2<br>INSA3<br>⋮ |
| CMB | INSB1<br>INSB2<br>INSB3<br>⋮ |
| CMC | INSC1<br>INSC2<br>INSC3<br>⋮ |
| ⋮ | ⋮ |

FIG.12

COMMAND LIST

| COMMAND | DESCRIPTIONS |
|---|---|
| RUN_SYS | SHIFT TO RUN MODE |
| STBY | SHIFT TO STANDBY MODE |
| SLP | SHIFT TO SLEEP MODE |
| INIT_SYS_RUN | INITIALIZE AND SHIFT TO RUN MODE |
| INIT_DSPE_CFG | INITIALIZE DISPLAY ENGINE |
| INIT_DSPE_TMG | INITIALIZE DISPLAY TIMING |
| RD_REG | READ REGISTER |
| WD_REG | WRITE REGISTER |
| BST_RD_SDR | BURST READ FROM IMAGE MEMORY |
| BST_WR_SDR | BURST WRITE TO IMAGE MEMORY |
| LD_IMG | LOAD FULL IMAGE |
| LD_IMG_AREA | LOAD AREA IMAGE |
| RD_WFM_INFO | READ WAVEFORM INFORMATION |
| UPD_GDRV_CLR | CLEAR SCAN DRIVER |
| WAIT_DSPE_TRG | WAIT FOR COMPLETION OF OPERATION BY DISPLAY ENGINE |
| ⋮ | ⋮ |

FIG.13

INTEGRATED CIRCUIT DEVICE AND ELECTRONIC EQUIPMENT

This application claims priority based on Japanese Patent Application No. 2009-182209, filed on Aug. 5, 2009, which is incorporated in this specification.

BACKGROUND

1. Technical Field

An aspect of the present invention relates to integrated circuit devices and an electronic equipment.

2. Related Art

Hitherto, a stack memory method has been known that stacks and packages a plurality of memories for a larger storage space. The technologies in the past of stack memory include the technology disclosed in JP-A-2000-91729.

However, the stack memory method stacks memories in the same pad array and does not stack chips having different pad arrays. For example, the stack memory method does not stack the chip of a display controller that performs display control over an electro-optical panel and the chip of an image memory.

Stacking first and second chips having different pad arrays and connecting the pads of the first chip and the pads of the second chip requires longer connection wires or causes a short-circuit between neighboring connection wires.

SUMMARY

Advantage of some aspects of the invention is to provide an integrated circuit device and an electronic equipment that allows stacking of memories while reducing occurrence of defective wiring.

An aspect of the invention relates to an integrated circuit device including a control unit that performs read-control and write-control over data in a memory stacked on the integrated circuit device, a first pad to an ith pad connected to a first memory pad to an ith memory pad of a memory stacked on the integrated circuit device, a jth pad to a kth pad connected to a jth memory pad to a kth ($1<i<j<k$) memory pad of the memory, and at least one pad arranged between the ith pad and the jth pad. The at least one pad is not connected to a memory pad of the memory and serves as a pad for inputting or outputting a signal between an external device and the integrated circuit device.

The first to ith pads connected to the first to ith memory pads of the memory and the jth to kth pads connected to the jth to kth memory pads may be provided in the integrated circuit device. Between the ith pad and the jth pad, at least one pad is provided that is not connected to a memory pad of the memory and is provided for inputting or outputting a signal between the external device and the integrated circuit device. Since such a pad is provided, the occurrence of defective wiring of a wire connecting the pads of the integrated circuit device and the memory pads of the memory stacked on the integrated circuit device can be reduced even when the ith memory pad and the jth memory pad are far apart from each other, for example.

The control unit may perform read-control and write-control over data in the memory in a stack mode in which the chip of the memory is stacked on the integrated circuit device and perform read-control and write-control over data in an external memory in a non-stack mode in which the chip of the memory is not stacked on the integrated circuit device, and the at least one pad arranged between the ith pad and the jth pad may be a non-stack mode pad for outputting or inputting at least one of a data signal, an address signal and a control signal from or to the external memory in the non-stack mode.

Thus, in the non-stack mode, at least one of the data signal, the address signal and the control signal in the external memory can be output or input through the at least one pad arranged between the ith pad and the jth pad. Therefore, the integrated circuit device that can support both of the stack mode and the non-stack mode can be provided.

No memory pads may be arranged between the ith memory pad and the jth memory pad.

Thus, even when a void area having no memory pads exists between the ith memory pad and the jth memory pad, a pad not connected to a memory pad is arranged between the ith pad and the jth pad. Therefore, the occurrence of defective wiring can be reduced, for example.

It may be configured such that the relation: LDS≥2LP, where LDS is the distance between the ith memory pad and the jth memory pad and LP is the arrangement pitch between memory pads, is satisfied.

Thus, even when the distance LDS between the ith memory pad and the jth memory pad is equal to or longer than 2LP, a pad not connected to a memory pad can be arranged between the ith pad and the jth pad to reduce the occurrence of defective wires.

A power supply pad may be arranged between the ith memory pad and the jth memory pad.

Thus, even when a power supply pad is arranged between the ith memory pad and the jth memory pad, the occurrence of defective wiring can be reduced by arranging a pad not connected to a memory pad between the ith pad and the jth pad, for example.

The first memory pad to the ith memory pad and the jth memory pad to the kth memory pad may be included in a first memory pad group arranged along a first chip side of the chip of the memory or included in a second memory pad group arranged along a third chip side on the opposite side of the first chip side of the chip of the memory. The first pad to the ith pad and the jth pad to the kth pad may be included in a first pad group arranged along a first side of the integrated circuit device or included in a second pad group arranged along a third side on the opposite side of the first side of the integrated circuit device.

Thus, the occurrence of defective wiring can be reduced when the first memory pad group of the memory and the first pad group of the integrated circuit device are connected or when the second memory pad group of the memory and the second pad group of the integrated circuit device are connected.

The memory may be an image memory that stores image data, and the control unit may perform display control over an electro-optical apparatus on the basis of image data stored in the image memory.

This can reduce the occurrence of defective wiring and at the same time allows stacking of an image memory that stores image data for display control over an electro-optical apparatus.

The integrated circuit device may include the first pad group connected to the first memory pad group arranged along the first chip side of the chip of the image memory and arranged along the first side of the integrated circuit device, the second pad group connected to the second memory pad group arranged along the third chip side of the chip of the image memory and arranged along the third side of integrated circuit device, and a third pad group that receives the output of a data signal and a control signal for display control over the electro-optical apparatus and are arranged along a second side crossing the first side and the third side of the integrated circuit device.

The first and second memory pad groups of the image memory are connected to the first and second pad groups. This allows exchange of signals for the image memory with the stacked image memory. On the basis of the image data read from the image memory, a signal for display control may be generated and be supplied to the external electro-optical apparatus through the third pad group. Since the image memory is stacked on the integrated circuit device, the area of the integrated circuit device can be reduced, compared with the case in the method that arranges the memory block corresponding to the image memory in a core area of the integrated circuit device. Since the first and second pad groups for connecting to the first and second memory pad groups of the image memory are arranged along the first and third sides of the integrated circuit device, simple connection can be provided between the first and second memory pad groups and the first and second pad groups. Therefore, the possibility of occurrence of defective wiring can be reduced.

The integrated circuit device may further include a fourth pad group for host interface. In this case, the fourth pad group may be arranged along a fourth side on the opposite side of the second side of the integrated circuit device.

Thus, a vacant area along the fourth side on the opposite side of the second side of the integrated circuit device can be effectively used to arrange the fourth pad group for host interface. Therefore, the pad groups can be efficiently arranged along the first, second, third and fourth sides.

The integrated circuit device may further include a fifth pad group that receives the output of a signal for control over a power supply circuit in the electro-optical apparatus. In this case, the fifth pad group may be arranged along the second side of the integrated circuit device.

Thus, since the fifth pad group for controlling the power supply circuit can be arranged along the same second side as the third pad group for display control, the efficiency of mounting can be improved, for example.

The control unit may perform display control over the electro-optical apparatus on the basis of the image data from the image memory in the stack mode in which the chip of the image memory is stacked on the integrated circuit device and perform display control over the electro-optical apparatus on the basis of external image data from an external image memory in the non-stack mode in which the chip of the image memory is not stacked on the integrated circuit device.

Switching between the stack mode and the non-stack mode allows the use of an external image memory.

The integrated circuit device may further include a stack identification pad that is set to a first power supply voltage in the stack mode with a bonding wire and is set to a second power supply voltage in the non-stack mode with the bonding wire.

Thus, voltage setting with a bonding wire to a pad for stack identification may only be required to set the stack mode or non-stack mode of the integrated circuit device.

The integrated circuit device may further include a host interface that performs interface processing to/from a host and an information register that provides information to the host. In this case, the information register may store instruction select information for selecting instruction code information describing instruction code configuring a command issued by the host. The instruction code information selected on the basis of the instruction select information stored in the information register from a plurality of instruction code information pieces may be loaded to a information memory when an electronic equipment including the electro-optical apparatus is produced. The control unit may perform operational control over the integrated circuit device on the basis of the command issued by the host and the instruction code information read from the information memory when the electronic equipment actually operates.

The information register may be used to provide the instruction select information for selecting instruction code information to a host. This allows loading of the instruction code information corresponding to the instruction select information to the information memory when the electronic equipment is produced. When the electronic equipment actually operates, operational control can be performed over the integrated circuit device on the basis of a command from the host and the instruction code information read from the information memory. As a result, the electronic equipment can be produced more efficiently.

The information register may store stack identification information for identifying, as the instruction select information, either the stack mode in which the chip of the image memory that stores image data is stacked on the integrated circuit device or the non-stack mode in which the chip of the image memory is not stacked on the integrated circuit device.

Thus, whether the integrated circuit device is in the stack mode or the non-stack mode can be provided to the host through the information register.

In the stack mode, when the electronic equipment is produced, the instruction code information for the stack mode from the plurality of instruction code information pieces may be loaded to the information memory. When the electronic equipment actually operates, operational control may be performed over the integrated circuit device on the basis of the command issued by the host and the instruction code information for the stack mode. In the non-stack mode, when the electronic equipment is produced, the instruction code information for the non-stack mode from the plurality of instruction code information pieces may be loaded to the information memory. When the electronic equipment actually operates, operational control may be performed over the integrated circuit device on the basis of the command issued by the host and the instruction code information for the non-stack mode.

Thus, when the integrated circuit device is in the stack mode, operational control is performed over the integrated circuit device on the basis of the instruction code information for the stack mode when the electronic equipment actually operates. When it is in the non-stack mode, operational control may be performed over the integrated circuit device on the basis of the instruction code information for the non-stack mode.

The integrated circuit device may further include a stack identification pad that is set to a first power supply voltage with in the stack mode the bonding wire and is set to a second power supply voltage in the non-stack mode with a bonding wire. In this case, the information register may store the stack identification information set on the basis of the voltage of the pad for stack identification.

Only by voltage setting with a bonding wire to the pad for the stack identification, the stack mode or non-stack mode of the integrated circuit device can be set.

Another aspect of the invention relates to an electronic equipment including the aforementioned integrated circuit device.

BRIEF DESCRIPTION OF THE DRAWINGS

The invention will be described with reference to the accompanying drawings, wherein like numbers reference like elements.

FIG. 12 is an explanatory diagram on instruction code information.

FIG. 13 illustrates examples of commands to be issued by a host.

DESCRIPTION OF EXEMPLARY EMBODIMENTS

Preferred embodiments of the invention will be described in detail below. The following embodiments do not invalidly limit the spirit and scope of the invention in the appended claims. All of configurations according to the embodiments are not typically required as solving means of the invention.

1. Configuration

Figure 1:
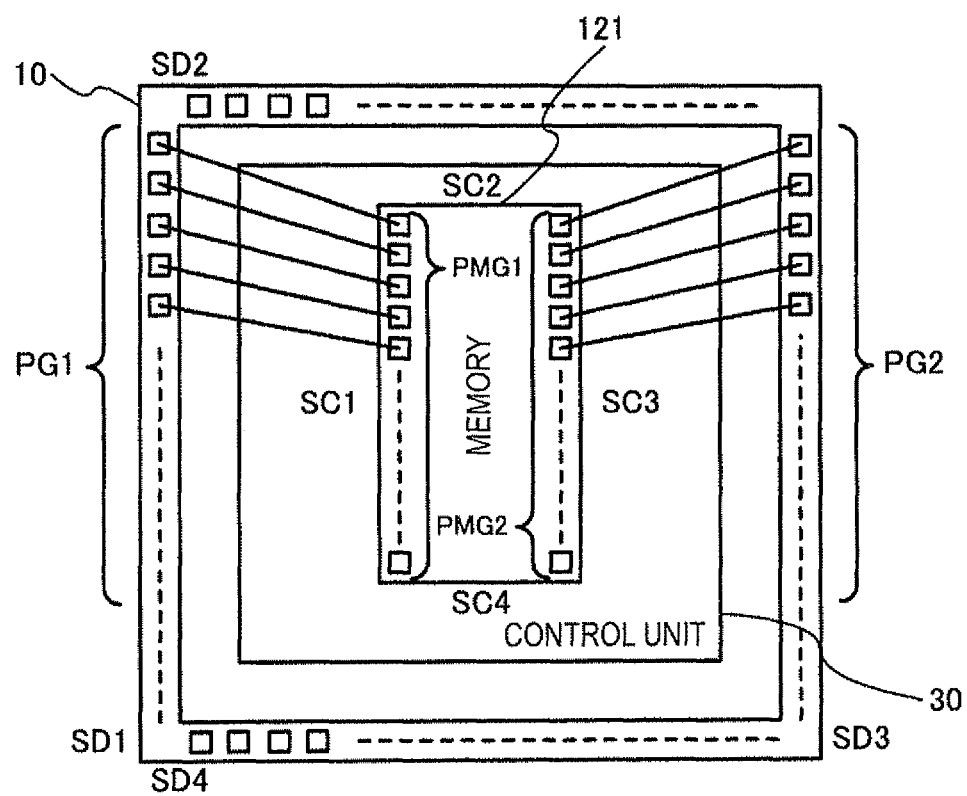
FIG. 1 illustrates a configuration example of an integrated circuit device of this embodiment.

FIG. 1 illustrates a configuration example of an integrated circuit device 10 of this embodiment. The integrated circuit device 10 has chips of a memory 121 stacked. In other words, two IC chips produced by different production processes are stacked and packaged by stack packaging.

Referring to FIG. 1, the integrated circuit device 10 includes a first pad group PG1 for memory and a second pad group PG2 for memory. In other words, these first and second pad groups PG1 and PG2 are placed at outer edges of the chip of the integrated circuit device 10. The integrated circuit device 10 includes a control unit 30 that controls reading and writing data from and to the memory 121.

The first pad group PG1 (electrode group) is connected to a first memory pad group PMG1 arranged along a first chip side SC1 of the chip of the memory 121 stacked on the integrated circuit device 10. More specifically, the first pad group PG1 and the first memory pad group PMG1 are wired internally within a package with bonding wires, for example.

The second pad group PG2 (electrode group) is connected to the second memory pad group PMG2 arranged along a third chip side SC3 on the opposite side of the first chip side SC1 of the chip of the memory 121. More specifically, the second pad group PG2 and the second memory pad group PMG2 are wired internally within a package with bonding wires, for example.

The control unit 30 performs control processing and may perform the control processing over the entire integrated circuit device 10 and memory control processing over the memory 121. The control unit 30 may be implemented by a gate array circuit or a processor, for example.

When the memory 121 is stacked on the integrated circuit device 10, as illustrated in FIG. 1, pads may be required to arrange in the pad groups PG1 and PG2 in the integrated circuit device 10 in the same signal order as in the memory pad groups PMG1 and PMG2. For example, when the pads for data signals are arranged in order of DQ0, DQ1, DQ2 . . . in the memory pad group PMG1, the pads for data signals may be required to arrange in order of DQ0, DQ1, DQ2 . . . also in the pad group PG1 connecting to the memory pad group PMG1.

However, the memory pads in the memory 121 are not always positioned with equal pad pitches. For example, some void areas (vacant areas) may exist between pads. This causes problems of long wiring (bonding wires) for connecting between memory pads of the memory 121 and pads of the integrated circuit device 10 and easy occurrence of a short circuit between neighboring wires.

Figure 2:
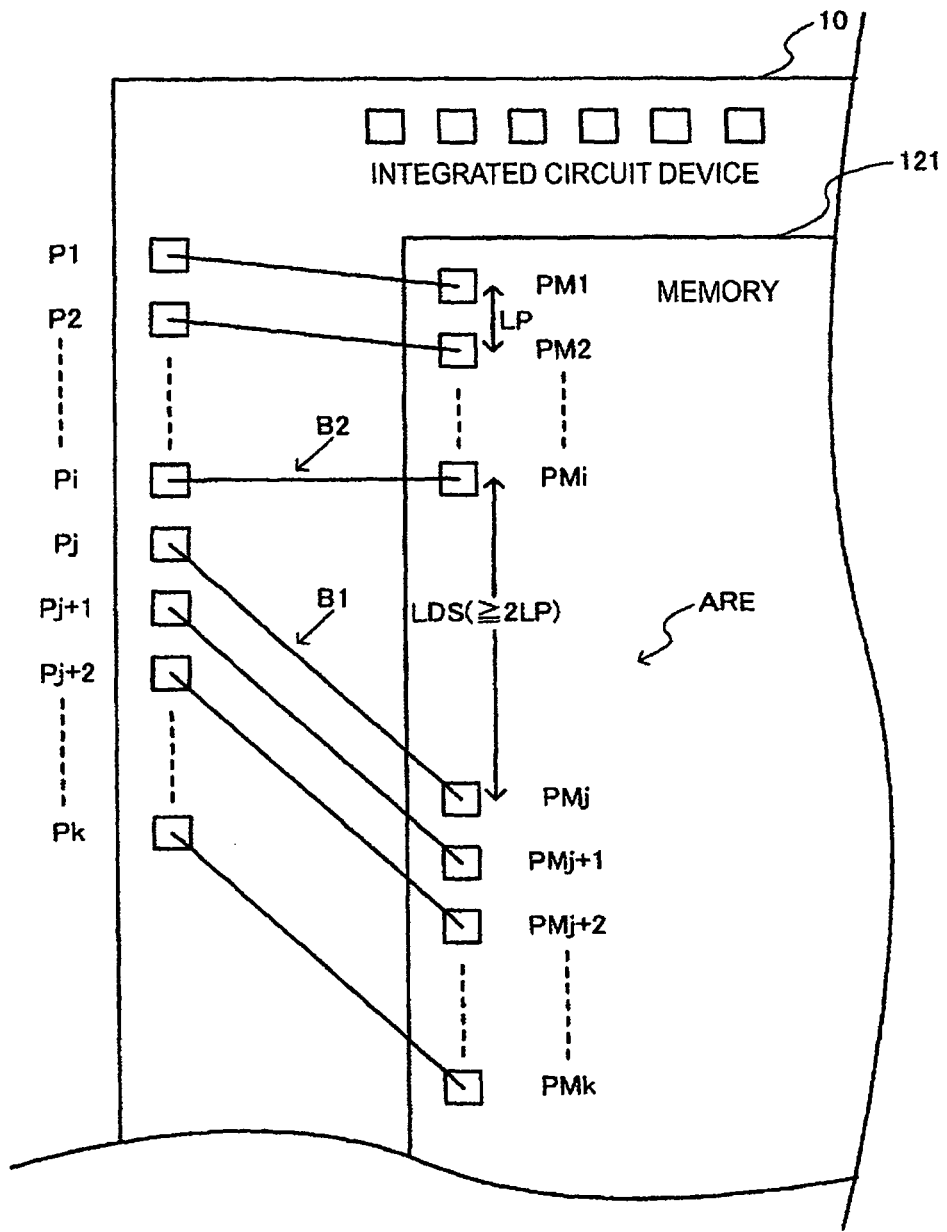
FIG. 2 is an explanatory diagram illustrating a pad arrangement/wiring method of a comparison example.

For example, FIG. 2 illustrates a pad arrangement/wiring method of a comparison example of this embodiment. Referring to FIG. 2, the memory 121 has thereon the first to ith memory pads PM1 to PMi and the jth to kth memory pads PMj to PMk. The first to ith memory pads PM1 to PMi are connected to the first to ith pads P1 to Pi in the integrated circuit device 10. The jth to kth (1<i<j<k) memory pads PMj to PMk are connected to the jth to kth pad Pj to Pk in the integrated circuit device 10.

In FIG. 2, a void area ARE (vacant area) where no memory pads are arranged exists between the memory pads PMi and PMj.

As illustrated in FIG. 2, stacking the memory 121 having thereon the memory pads PM1 to PMi and PMj to PMk on the integrated circuit device 10 requires long wiring for connecting between memory pads of the memory 121 and pads of the integrated circuit device 10, which may easily cause defective wires. For example, the wire indicated by B1 in FIG. 2 is longer than the wire indicated by B2, and the wiring angle is an acute angle. Thus, defective wires may easily occur. When wire lengths differ as indicated by B1 and B2, the difference in signal delay due to the difference in wire length may possibly cause misoperations by the memory 121.

Figure 3:
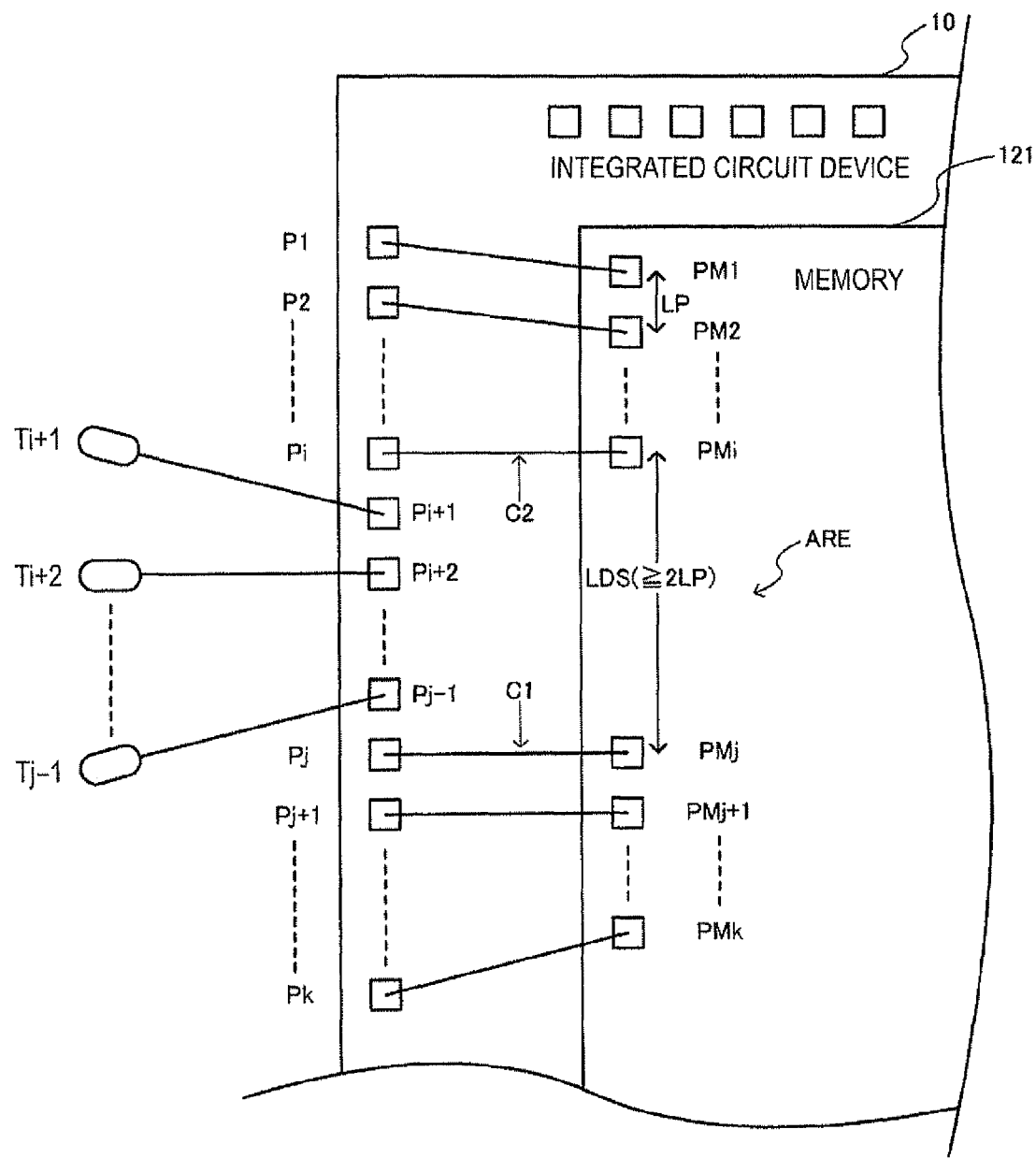
FIG. 3 is an explanatory diagram illustrating a pad arrangement/wiring method of this embodiment.

Accordingly, this embodiment applies pad arrangement/wiring as illustrated in FIG. 3.

The integrated circuit device 10 of this embodiment in FIG. 3 includes the first to ith pads P1 to Pi connected to the first to ith memory pads PM1 to PMi in the memory 121, and the jth to kth pads Pj to Pk connected to the jth to kth memory pads PMj to PMk in the memory 121.

The integrated circuit device 10 of this embodiment further includes at least one pad (Pi+1 to Pj−1) between the ith pad Pi and the jth pad Pj. The pads Pi+1 to Pj−1 are not connected to the memory pads of the memory 121 and function as pads (such as an input pad, an output pad and an input/output pad) for inputting and outputting signals (such as a data signal, a control signal and an address signal) to and from external devices to the integrated circuit device 10. More specifically, the pads Pi+1 to Pj−1 are connected to package internal terminal Ti+1 to Tj−1 via bonding wires. The pads Pi+1 to Pj−1 are electrically connected to wiring on the circuit substrate mounting the package of the integrated circuit device 10 through package external terminals (IC pins or bumps) corresponding to the package internal terminal Ti+1 to Tj−1. The control unit 30 transmits and receives signals to and from an external device on the circuit substrate or an external device on a circuit substrate or a module connected to the circuit substrate via a connector, for example, through the pads Pi+1 to Pj−1.

Referring to FIG. 3, the pads Pi+1 to Pj−1 are provided in association with a void area ARE present between the memory pads PMi and PMj of the memory 121. It is assumed here, for example, that the distance between the memory pads PMi and PMj is LDS and the arrangement pitch between memory pads is LP. In this case, in FIG. 3, the distance LDS between the memory pads PMi and PMj satisfies a relationship LDS≥2LP. In other words, the area between the memory pads PMi and PMj is a void area ARE in which at least one memory pad can be arranged. In FIG. 3, the pads Pi+1 to Pj−1 are provided in association with such void areas ARE.

According to this embodiment, the pads Pi+1 to Pj−1 to which no memory pads are connected are provided between the pad Pi and pad Pj. In other words, the pads Pi+1 to Pj−1 not connected to memory pads are provided between the pads P1 to Pi connected to the memory pads PM1 to PMi and the pads Pj to Pk connected to the memory pads PMj to PMk. The control unit 30 inputs or outputs signals to or from an external device to the integrated circuit device 10 through the pads Pi+1 to Pj−1 not connected to memory pads.

This can prevent long wiring for connecting between the pad Pj and the memory pad PMj, for example, as indicated by C1 in FIG. 3. For example, comparing B1 and B2 in FIG. 2 and C1 and C2 in FIG. 3, according to this embodiment, the difference in length of wiring for connecting memory pads and pads of the integrated circuit device 10 can be reduced, and the wiring angle is prevented from being acute. Therefore, the occurrence of defective wires can be suppressed. The reduction of difference in wire length can prevent misoperations by the memory 121 caused by a difference in signal delay due to the difference in wire length.

Particularly, when a void area ARE exists between the memory pads PMi and PMj, the wire lengths may differ largely, or the wiring angle may easily be acute as indicated by B1 and B2 in FIG. 2.

According to this embodiment, the pads Pi+1 to Pj−1 to which no memory pads are connected are provided in association with the void areas ARE. This can reduce differences in wire length and prevent the wiring angle from being acute even when a void area ARE exists.

According to a comparison example of this embodiment, the pads Pi+1 to Pj−1 may be non-connected pads (NC pads) to which no wires are connected.

However, the number of pads that can be arranged in a pad area is limited by the chip size of the integrated circuit device. Providing NC pads as in the comparison example can reduce the number of valid pads by the number of the provided NC pads. The chip size may be increased when many pads are required for communication with external devices.

According to this embodiment, the pads Pi+1 to Pj−1 corresponding to the void areas ARE are provided, and the pads Pi+1 to Pj−1 are used to exchange signals with external devices. Comparing with the comparison example in which the pads Pi+1 to Pj−1 are NC pads, the pad areas in the outer edge parts of the integrated circuit device can be effectively used for exchanging many signals with external devices, and an increase in chip size can be prevented.

2. Non-Stack Mode Pad

According to this embodiment, the pads Pi+1 to Pj−1 to be arranged between the pads Pi and Pj may be non-stack mode pads, for example.

For example, the memory pad groups PMG1 and PMG2 of the memory 121 function as pads for input/output of address signals, data signals or control signals in the memory 121. The control signals may include, in a synchronous DRAM (SDRAM), for example, a chip select signal, a clock enable signal, a clock signal, a RAS signal, a CAS signal, and a write enable signal. Connecting the memory pad groups PMG1 and PMG2 of the memory 121 and the pad groups PG1 and PG2 of the integrated circuit device 10 and thus exchanging an address signal, a data signal and/or a control signal allow the control unit 30 to write or read data to or from the memory 121.

Figure 4A:
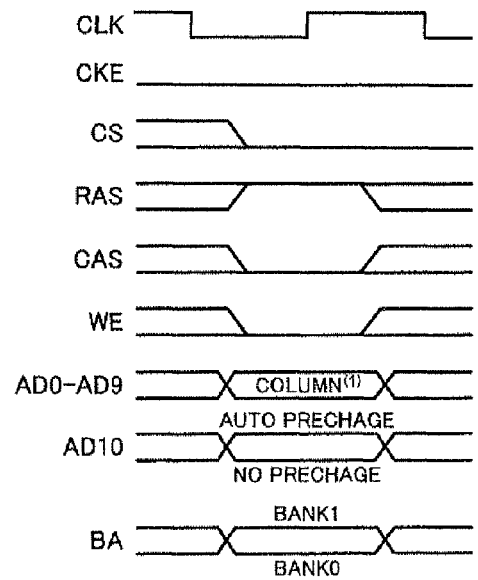
FIGS. 4A to 4C illustrate waveform examples of memory signals.
Figure 4B:
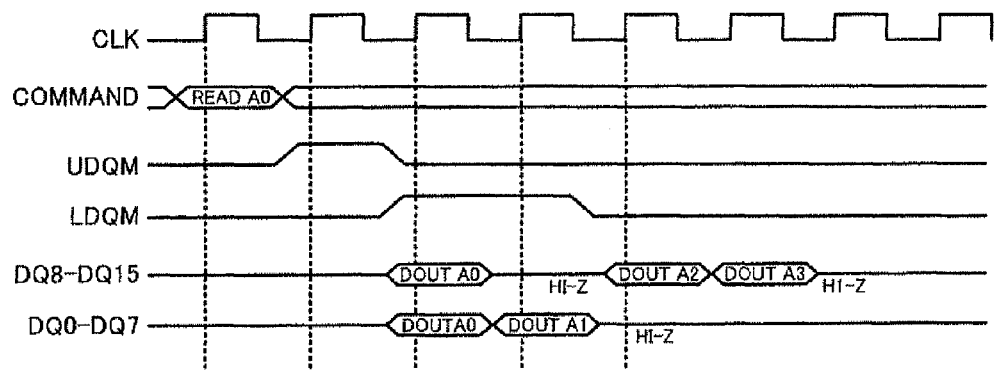
Figure 4C:
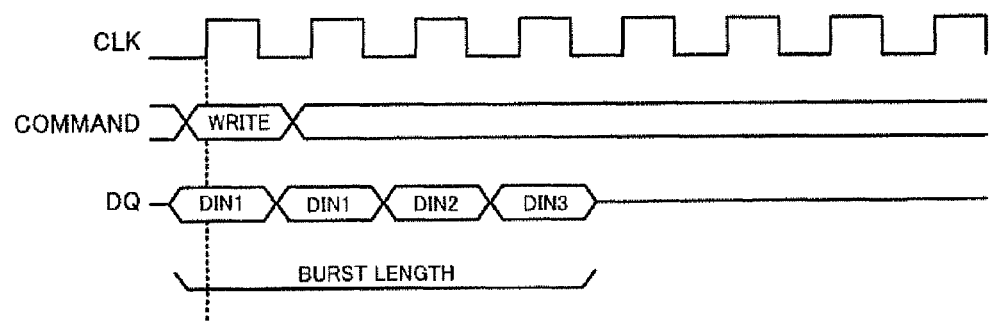

FIGS. 4A to 4C illustrate waveform examples of memory signals to be exchanged between the memory pad groups PMG1 and PMG2 and the pad groups PG1 and PG2 in FIG. 1.

FIG. 4A is a signal waveform example for writing a command. CLK, CKE and CS refer to a clock signal, a clock enable signal, and a chip select signal, respectively. RAS and CAS refer to a row address strobe signal and a column address strobe signal, respectively, and WE refers to a write enable signal. AD0 to AD10 refer to address signals, and AD10 is also used for designating a precharge mode. BA refers to a bank select signal.

In FIG. 4A, the signals CS, CAS, and WE are enabled, and AD0 to AD9 are used to designate a column address. AD10 and BA are used to designate a precharge mode and select a bank. At an edge of the signal CLK, a command is written.

FIG. 4B is a signal waveform example in burst reading. DQ0 to DQ15 are data signals, and UDQM and LDQM are signals for controlling the upper order byte and lower order byte of a data output buffer (DQ buffer), respectively. When the signals UDQM and LDQM are active, the corresponding byte in the buffer is enabled.

The burst reading cycle in FIG. 4B is started by execution of a read command designating a start address A0. After a lapse of a latency period, the address automatically increments in synchronism with the clock signal CLK, and the data signals DQ0 to DQ15 are output and read from the memory 121. Here, the signals UDQM and LDQM allow masking the upper order byte and lower order byte.

FIG. 4C is a signal waveform example in burst writing. A burst writing cycle is started by the execution of a write command, and the address supplied upon execution of the write command is set to the start address. Then, in synchronism with the clock signal CLK, a data signal DQ is input and written to the memory 121.

Between the pad groups PG1 and PG2 of the integrated circuit device 10 and memory pad group PMG1 and PMG2 of the memory 121 in FIG. 1, the data signals, address signals and control signals as illustrated in FIGS. 4A to 4C are exchanged.

The pads Pi+1 to Pj−1 arranged between the pads Pi and Pj according to this embodiment may be non-stack mode pads.

In other words, the integrated circuit device 10 of this embodiment may have a stack mode and non-stack mode, for example. The stack mode (stacked state) refers to a mode (or state) that chip of the memory 121 is stacked on the integrated circuit device 10 while the non-stack mode (non-stacked state) refers to a mode (or state) that the chip of the memory 121 is not stacked on the integrated circuit device.

In the stack mode that the chip of the memory 121 is stacked on the integrated circuit device 10, the control unit 30 performs read-control and write-control over data in the memory 121. On the other hand, in the non-stack mode that the chip of the memory 121 is not stacked on the integrated circuit device 10, the control unit 30 performs read-control and write-control over data in an external memory. In other words, in the non-stack mode, since the memory 121 is not stacked, an external memory is used instead of the memory 121 to read data from an external memory or write data to an external memory.

The pads Pi+1 to Pj−1 for the non-stack mode function as pads for outputting or inputting at least one signal of data signals, address signals and control signals from or to an external memory in the non-stack mode.

Figure 5:
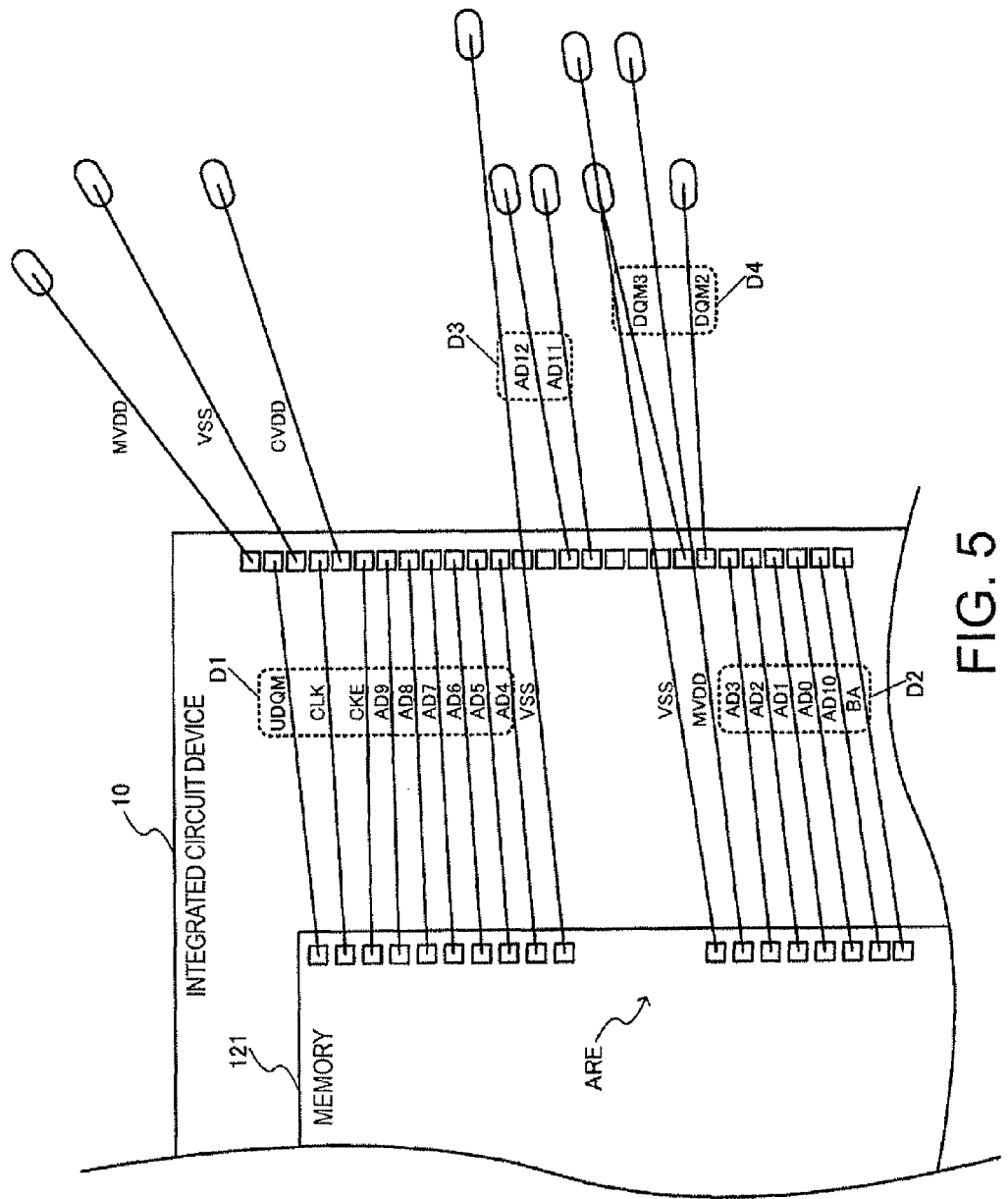
FIG. 5 illustrates a detail example of the pad arrangement/wiring method.
Figure 6:
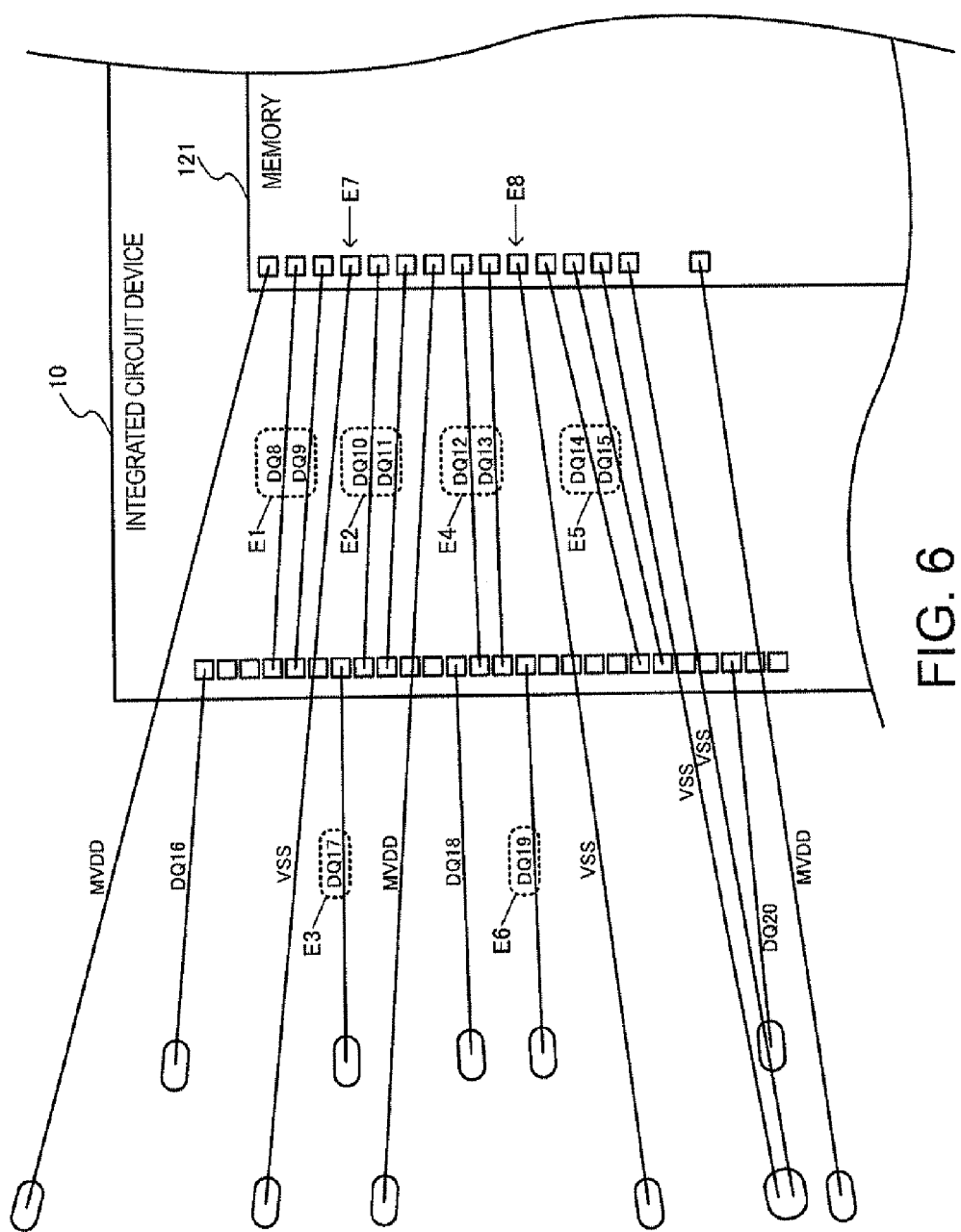
FIG. 6 illustrates a detail example of the pad arrangement/wiring method.

FIGS. 5 and 6 illustrate detail arrangement/connection examples of pad groups of the integrated circuit device 10 and memory pad groups of the memory 121.

In FIG. 5, the pads for the signals indicated by D1 correspond to the pads P1 to Pi in FIG. 3, and the pads for the signals indicated by D2 correspond to the pads Pj to Pk in FIG. 3. In other words, between the pads P1 to Pi of the integrated circuit device 10 and the memory pads PM1 to PMi, the signals UDQM, CLK, CKE, and AD9 to AD4 indicated by D1 are exchanged. Between the pads Pj to Pk and the memory pads PMj to PMk, the signals AD3 to AD0, AD10, and BA indicated by D2 are exchanged.

In FIG. 5, the pads for the signals indicated by D3 and D4 correspond to the pads Pi+1 to Pj−1 not connected to the memory pads in FIG. 3. In other words, in association with the void areas ARE in the memory 121, pads Pi+1 to Pj−1 for exchanging the signals AD12, AD11, DQM3, and DQM2 with an external memory are provided.

In FIG. 6, the pads for the signals DQ8 and DQ9 indicated by E1 correspond to the pads P1 to Pi in FIG. 3, and the pads for the signals DQ10 and DQ11 indicated by E2 correspond to the pads Pj to Pk in FIG. 3. The pad for the signal DQ17 indicated by E3 corresponds to the pads Pi+1 to Pj−1 not connected to any memory pads. Similarly, the pads for the signals DQ12 and DQ13 indicated by E4 correspond to the pads P1 to Pi, and the pads for the signals DQ14 and DQ15 indicated by E5 correspond to the pads Pj to Pk. The pad for the signal DQ19 indicated by E6 corresponds to the pads Pi+1 to Pj−1 not connected to any memory pads.

Referring to FIG. 6, between the memory pad PMi for the signal DQ9 indicated by E1 and the memory pad PMj for the signal DQ10 indicated by E2, a memory pad for power supply VSS is provided as indicated by E7. Similarly, between the memory pad PMi for the signal DQ13 indicated by E4 and the memory pad PMj for the signal DQ14 indicated by E5, a memory pad for power supply VSS is provided as indicated by E8. In other words, the pad for the signal DQ17 indicated by E3 is provided in association with the memory pad for the power supply VSS indicated by E7, and the pad for the signal DQ19 indicated by E6 is provided in association with the memory pad for the power supply VSS indicated by E8. Thus, not only when a void area ARE exists as in FIG. 5 but also when a memory pad for power supply is provided, the difference in wire length can be reduced, and the wiring angle can be prevented from being acute.

As illustrated in FIGS. 5 and 6, in the stack mode in which the memory 121 is stacked on the integrated circuit device 10, address signals are AD0 to AD10, and data signals are DQ0 to DQ15. In other words, in the stack mode, the memory 121 is used in which an address has a bit width of 11 bits, and data has a bit width of 16 bits.

On the other hand, in the non-stack mode in which the memory 121 is not stacked on the integrated circuit device 10, address signals are AD0 to AD12, and data signals are DQ0 to DQ31 (DQ21 to DQ31 of which are not shown). In other words, in the non-stack mode, an external memory can be used in which an address has a bit width of 13 bits, and data has a bit width of 32 bits. In the non-stack mode in which an external memory can be used, the bit widths of addresses and data can be extended.

Furthermore, the non-stack mode in which an external memory can be used allows the use of byte control signals DQM2 and DQM3 (control signals in a broad sense) for output data signals as indicated by D4. In other words, the bit count of a byte control signal for masking a data signal can be extended.

In FIGS. 5 and 6 in this way, the pads Pi+1 to Pj−1 arranged between the pad Pi and pad Pj in FIG. 3 function as pads for outputting or inputting at least one signal of data signals, address signals and control signals relative to an external memory in the non-stack mode. In other words, the pads Pi+1 to Pj−1 function as pads for outputting or inputting data signals (DQ16 to DQ31), address signals (AD11 and AD12) or control signals (DQM2 and DQM3) that are not used in the stack mode but are used in the non-stack mode.

For example, the pads for the signals indicated by D3 in FIG. 5 (pads Pi+1 to Pj−1) function as pads for outputting the address signals AD11 and AD12 to an external memory in the non-stack mode. The pads for the signals indicated by D4 function as pads for outputting the control signals DQM2 and DQM3 to an external memory in the non-stack mode. The pads for signals indicated by E3 and E6 in FIG. 6 function as pads for inputting or outputting data signals DQ17 and DQ19 to or from an external memory in the non-stack mode.

Referring to FIGS. 5 and 6, in association with void areas ARE and power supply memory pads, non-stack mode pads for inputting/outputting the address signals AD11 and AD12, data signals DQ16 to DQ31 and/or control signals DMG2 and DMQ3 for an external memory are arranged in the integrated circuit device 10. This allows easy support for the extension of bit widths of control signals for addresses and data with the use of an external memory in the non-stack mode.

For example, in the stack mode, the pads of the integrated circuit device 10 corresponding to the address signals AD0 to AD10, and data signals DQ0 to DQ15 are connected to the memory pads of the memory 121 corresponding to the address signals AD0 to AD10, and data signals DQ0 to DQ15. Thus, the stack mode can be supported.

On the other hand, in the non-stack mode, the pads of the integrated circuit device 10 corresponding to the address signals AD0 to AD12 and data signals DQ0 to DQ31 are connected to the package internal terminals (Ti+1 to Tj−1 in FIG. 3). The address signals AD0 to AD12 and data signals DQ0 to DQ31 can input/output to/from an external memory through package internal terminals and package external terminals (such as IC pins and bumps). Thus, an external memory having larger bit widths for addresses and data can be used. In other words, both of the stack mode and the non-stack mode can be supported.

3. Application Examples to Image Memory and Display Controller

Next, application examples of this embodiment will be described in which an image memory is the memory to be stacked on the integrated circuit device, and display control is performed over an electro-optical apparatus on the basis of image data from the image memory.

Figure 7:
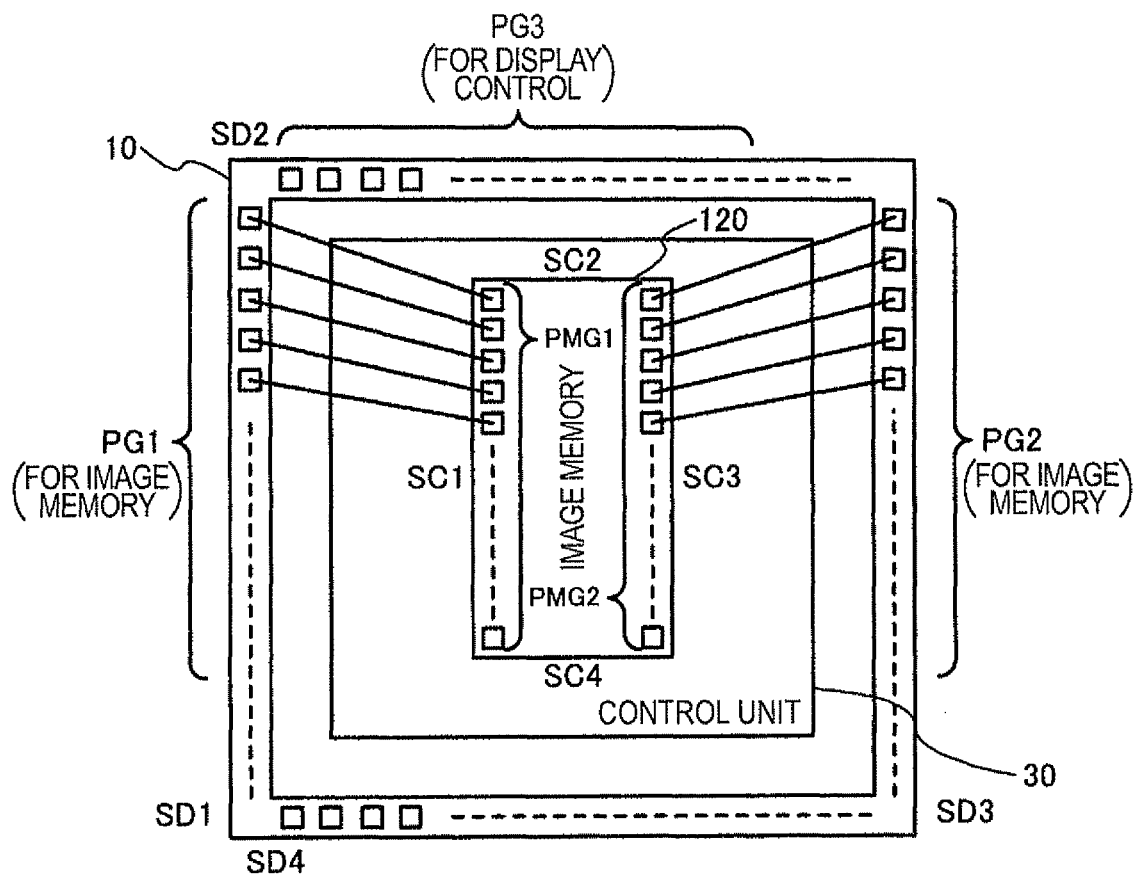
FIG. 7 is an application example of the method of this embodiment to an image memory and a display controller.

Referring to FIG. 7, the integrated circuit device 10 includes an image memory first pad group PG1, an image memory second pad group PG2, and a third pad group PG3 for display control. In other words, these first, second, and third pad group PG1, PG2, and PG3 are arranged on outer edges of the chip of the integrated circuit device 10. The integrated circuit device 10 further includes a control unit 30 performs display control over an electro-optical apparatus such as a liquid crystal display device and an electrophoretic display device on the basis of image data (display data) stored in the image memory 120.

Here, the first pad group PG1 (electrode group) is connected to the first memory pad group PMG1 arranged along the first chip side SC1 of the image memory 120. The second pad group PG2 (electrode group) is connected to the second memory pad group PMG2 arranged along the third chip side SC3 on the opposite side of the first chip side SC1 of the image memory 120.

In this case, the memory pads PM1 to PMi and PMj to PMk in FIG. 3 are memory pads included in the first memory pad group PMG1 or memory pads included in the second memory pad group PMG2 in the image memory 120 in FIG. 7. The pads P1 to Pi and Pj to Pk in FIG. 3 are pads included in the first pad group PG1 or pads included in the second pad group PG2 in the integrated circuit device 10 in FIG. 7.

The third pad group PG3 in FIG. 7 outputs data signals and control signals for display control over an electro-optical apparatus. For example, the third pad group PG3 outputs data signals and/or control signals to be supplied to a data driver (source driver) and/or scan driver (gate driver) in the electro-optical apparatus. The electro-optical apparatus may be any of various apparatuses such as a liquid crystal display device, an electrophoretic display device, and an organic electroluminescence display device.

The control unit 30 further performs various kinds of control processing including display control processing over electro-optical apparatus. The control unit 30 performs control processing over the entire integrated circuit device 10 and memory control processing over the image memory 120. The control unit may be implemented by a gate array circuit or processor, for example.

In FIG. 7, the image memory first pad group PG1 is arranged along the first side SD1 of the integrated circuit device 10, and the image memory second pad group PG2 is arranged along the third side SD3 on the opposite side of the first side SD1 of the integrated circuit device 10. The third pad group PG3 for display control is arranged along the second side SD2 crossing the first side SD1 and third side SD3 of the integrated circuit device 10. In other words, the first, second, and third pad groups PG1, PG2, and PG3 are arranged in pad areas at outer edges of the integrated circuit device 10 along the sides SD1, SD2, and SD3.

The integrated circuit device 10 has thereon first, second, and third I/O cell groups, not shown, connected to the first, second, and third pad groups PG1, PG2, and PG3. The first, second, and third I/O cell groups are arranged side by side in an internal I/O area of the pad area where the first, second, and third pad groups are arranged. In an internal core area of the pad area and I/O area, an analog circuit such as a PLL and a memory block functioning as a work memory may be arranged in addition to the control unit 30 being a logic circuit.

The first and second memory pad groups PMG1 and PMG2 may be pads for inputting/outputting address signals, data signals and/or control signals relative to the image memory 120, for example. The connection between the first and second memory pad groups PMG1 and PMG2 and the first and second pad groups PG1 and PG2 and exchange of address signals, data signals and control signals allow the control unit 30 to write and/or read image data to/from the image memory 120.

In the integrated circuit device 10 in FIG. 7, the pad groups PG1 and PG2 and memory pad groups PMG1 and PMG2 are internally connected. Thus, the integrated circuit device 10 and the image memory 120 stacked thereon can exchange data signals, address signals, and/or control signals for image memory. On the basis of the image data read from the image memory 120, data signals and control signals for display control can be generated and be supplied to an external electro-optical apparatus (or electro-optical panel) through the pad group PG3.

For example, according to a first comparison example of this embodiment, the image memory may be an external image memory. However, the first comparison example may require wiring of signal lines for data signals, address signals and control signals for the image memory on a circuit substrate (such as a system substrate) on which a package of an integrated circuit device is to be mounted. This complicates the wiring of signal lines for the image memory on the circuit substrate and may possibly reduce the efficiency for mounting. When the mounted position of the integrated circuit device and the mounted position of the external image memory are apart from each other, the data reading/writing errors may occur owing to signal delay caused by parasitic capacitance/parasitic resistance of signal lines for connect between the integrated circuit device and an external image memory.

According to this embodiment, the image memory 120 is stacked on the integrated circuit device 10 being a display controller. Thus, without using an external image memory, the image memory 120 within an IC package can be used as a memory for storing frame image data. This can prevents the complicated wiring of signal lines for connecting to an external image memory, reduction in the efficiency of mounting, and the occurrence of data reading/writing errors due to signal delays.

According to a second comparison example of this embodiment, a memory block (SRAM) corresponding to an image memory may be arranged in a core area of the integrated circuit device, and frame image data may be stored in the memory block.

However, the second comparison example may require the arrangement of a memory block having the storage capacity corresponding to frame image data to a core area of the integrated circuit device. This may possibly increase the chip area of the integrated circuit device and increase the costs.

According to this embodiment, since the image memory 120 is stacked on the integrated circuit device 10, a memory block as described above may not be required to arrange in the core area. This can reduce the chip area of the integrated circuit device 10 and reduce the costs more than the second comparison example. The stacking of the image memory 120 may allow easy application of a high velocity memory such as an SDRAM allowing burst reading and burst writing, for example. This can provide faster reading/writing on image data than the second comparison example.

According to this embodiment, when the memory pad group PMG1 is arranged on the chip side SC1 that is the longitudinal side of the image memory 120, the pad group PG1 is arranged along the side SD1 of the integrated circuit device 10 corresponding to the chip side SC1 in the same signal order as that of the memory pad group PMG1. Similarly, when the memory pad group PMG2 is arranged on the chip side SC3 that is the longitudinal side of the image memory 120, the pad group PG2 is arranged along the side SD3 of the integrated circuit device 10 corresponding to the chip side SC3 in the same signal order as that of the memory pad group PMG2. Thus, when the memory pad groups PMG1 and PMG2 are arranged along the chip sides SC1 and SC3 on both sides of the image memory 120, the memory pad groups PMG1 and PMG2 and the pad groups PG1 and PG2 of the integrated circuit device 10 can be connected without placing bonding wires one over another. Thus, the image memory 120 having the memory pad groups PMG1 and PMG2 on both sides of the chip is stacked on the integrated circuit device 10, and the signal lines can be easily arranged. This can reduce the possibility of a short circuit with defective wires such as bonding wires.

For example, the pad groups PG1 and PG2 for image memory belong to the same power supply group that supplies the same power supply voltage to I/O cells. For this reason, it has been difficult to stack the chip of the image memory 120 having the memory pad groups PMG1 and PMG2 along the chip sides SC1 and SC3 on both sides.

Referring to FIG. 7, the pad group PG1 connected to the memory pad group PMG1 along the chip side SC1 of the image memory 120 is arranged along the side SD1 of the integrated circuit device 10. The pad group PG2 connected to the memory pad group PMG2 along the chip side SC3 is arranged along the side SD3 of the integrated circuit device 10. Thus, according to this embodiment, even the image memory 120 having the memory pad groups PMG1 and PMG2 belonging to the same power supply group on both sides of the chip can be stacked on the integrated circuit device 10.

According to this embodiment, the pad group PG3 for display control is arranged along the side SD2 crossing the sides SD1 and SD3 having the pad groups PG1 and PG2 for image memory. This can prevent overlaps of the bonding wires for internally connecting the memory pad groups PMG1 and PMG2 and the pad groups PG1 and PG2 and the bonding wires for connecting the pad group PG3 and internal terminals of the package. Therefore, bonding wires can be arranged more easily, and the possibility of a short circuit between bonding wires such as defective wires can be reduced.

The stack mode and the non-stack mode may be switchable, as will be described below. In the non-stack mode, the pad groups PG1 and PG2 for image memory are connected to an external image memory through external terminals (such as bumps) and wiring on the circuit substrate of the package of the integrated circuit device 10. The pad group PG3 for display control is connected to an electro-optical apparatus through external terminals and wiring of the circuit substrate and/or connectors of the package. While the pad groups PG1 and PG2 for image memory are collectively arranged along the sides SD1 and SD3, the pad group PG3 for display control is collectively arranged along the side SD2 which is different from the sides SD1 and SD3. Thus, the signal lines on the circuit substrate can be arranged more easily, and the efficiency of mounting can be improved, for example. Particularly, the pad groups PG1 and PG2 for image memory and the pad group PG3 for display control have many pads, and the reference power supply voltages may often be different. The collective arrangement of the pad groups along different sides as illustrated in FIG. 7 can increase the efficiency of layout in the chip and/or the efficiency of mounting in the circuit substrate.

Figure 8:
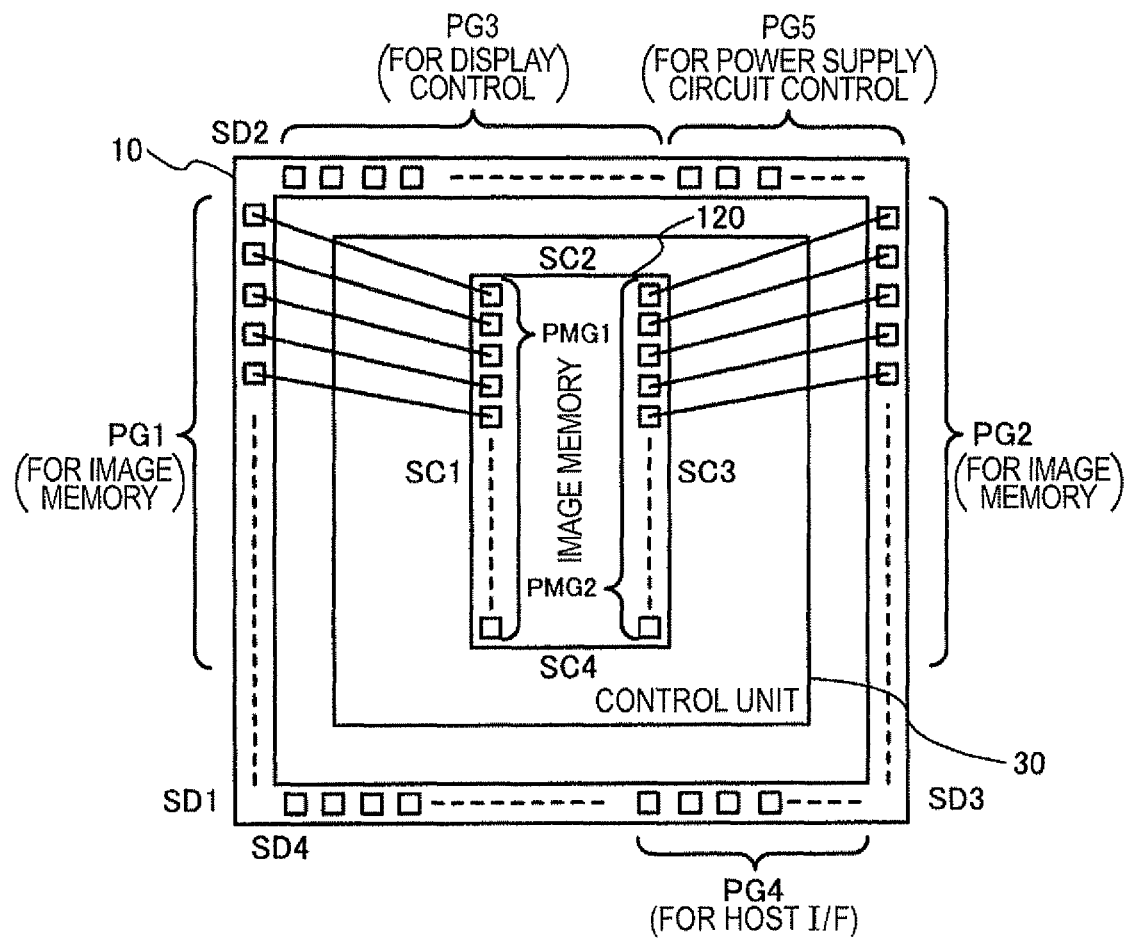
FIG. 8 is an application example of the method of this embodiment to an image memory and a display controller.

FIG. 8 illustrates a more detail arrangement example of pad groups. In FIG. 8, the integrated circuit device 10 includes a fourth pad group PG4 for a host interface (I/F). The fourth pad group PG4 is arranged along a fourth side SD4 on the opposite side of the second side SD2 of the integrated circuit device 10.

In FIG. 8, the integrated circuit device 10 includes a fifth pad group PG5 that outputs signals for controlling a power supply circuit in an electro-optical apparatus. The fifth pad group PG5 is arranged along the second side SD2 of the integrated circuit device 10.

For example, the integrated circuit device 10 such as a display controller may require a host I/F for issuing commands from a host to the integrated circuit device 10 or inputting image data from a host. Since the host I/F is required to transmit and receive data signals, for example, many pads are often necessary for the host I/F.

On the other hand, in FIG. 8, the pad groups PG1 and PG2 for image memory are arranged along the sides SD1 and SD3, and the pad group PG3 for display control is arranged along the side SD2. Thus, providing vacant areas for arranging pads is difficult in the areas along those sides.

According to this embodiment, vacant areas along the side SD4 on the opposite side of the side SD2 is effectively used to arrange the pad group PG4 for the host I/F. Thus, the pad groups can be arranged efficiently along the sides SD1, SD2, SD3, and SD4. In other words, the pad groups PG1 and PG2 for image memory are collectively arranged along the sides SD1 and SD3, the pad group PG3 for display control is collectively arranged along the side SD2, and the pad group PG4 for the host I/F is collectively arranged along the side SD4. Since the pad groups PG1, PG2, PG3, and PG4 having many pads can be collectively arranged along the corresponding sides, efficient pad arrangement can be provided. External terminals (such as bumps and IC pins) of the package of the integrated circuit device 10 can be collectively and closely arranged for image memory, display control and the host I/F. This can simplify the wiring of signal lines on the circuit substrate and can improve the efficiency of mounting. A part of the pad group PG4 for the host I/F may be arranged in an area along the side SD3, for example.

In FIG. 8, the pad group PG5 for control over the power supply circuit is arranged along the same side SD2 as the pad group PG3 for display control. The power supply circuit supplies power to electro-optical apparatus that receives data signals and control signals for display control from the pad group PG3. Arranging the pad group PG3 for display control and the pad group PG5 for power supply circuit control along the same side SD2 allows signal lines for display control and signal lines for power supply circuit control wired from the pad groups PG3 and PG5 through external terminals of the package of the integrated circuit device 10 to be drawn and wired in the same direction on the circuit substrate. Thus, the signal lines can be wired more efficiently on the circuit substrate, and the efficiency of mounting can be improved.

Figure 9:
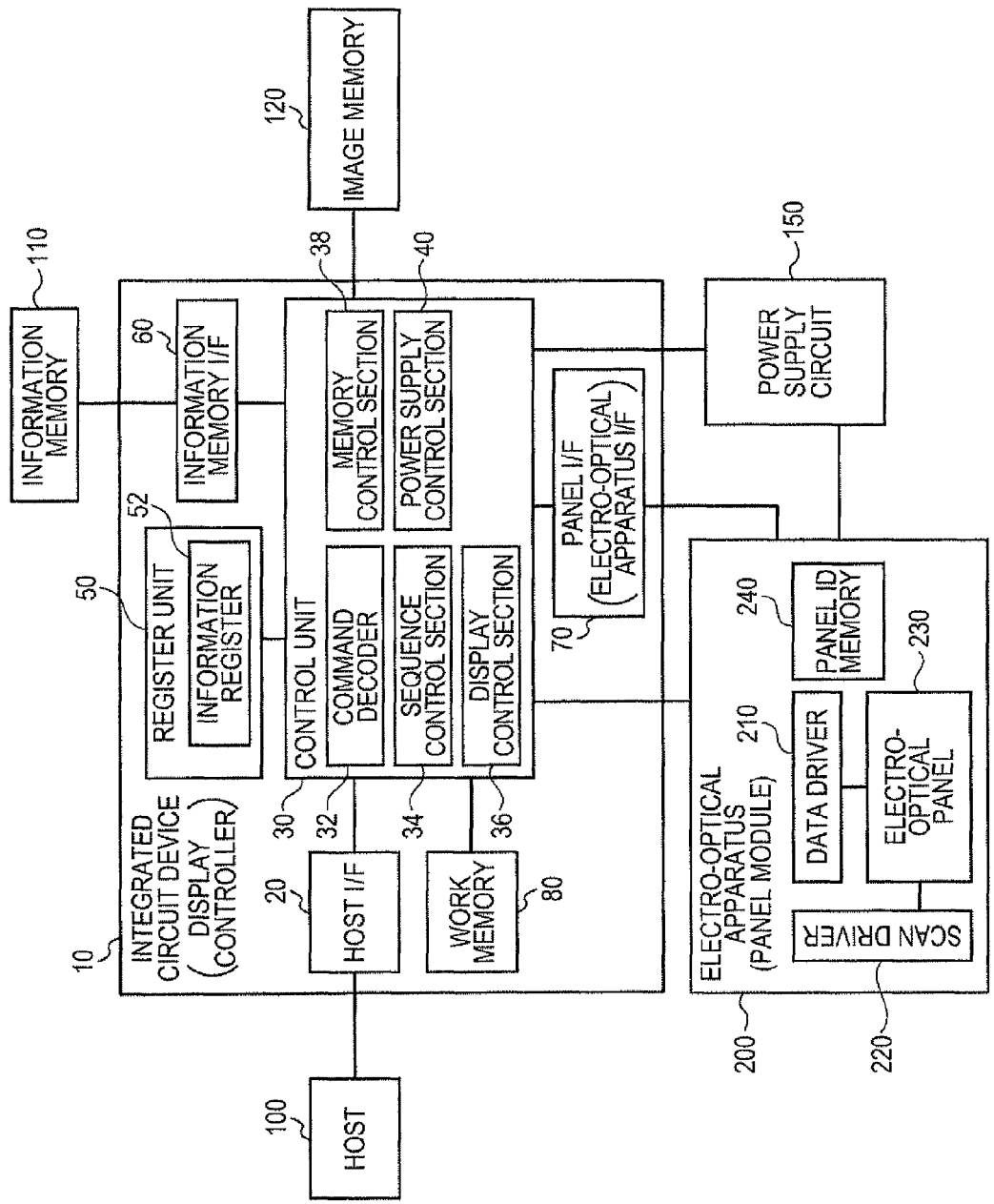
FIG. 9 illustrates detail configuration examples of an integrated circuit device of this embodiment and an electronic equipment including it.

4. Detail Configuration Examples of Integrated Circuit Device and Electronic Equipment FIG. 9 illustrates detail configuration examples of the integrated circuit device 10 of this embodiment and an electronic equipment including it. The electronic equipment includes the integrated circuit device 10 functioning as a display controller, for example, and an electro-optical apparatus 200 under display control by the integrated circuit device 10. The electronic equipment may include a host 100, an information memory 110, an image memory 120, and a power supply circuit 150.

The electronic equipment according to this embodiment is not limited to the configuration illustrated in FIG. 9, but a part (such as a power supply circuit) of the components may be omitted, or other components (such as an operating section) may be added for different variations. The electronic equipment of this embodiment may be various apparatus such as an electronic book, an electronic dictionary, a portable information terminal, a cellular phone, a portable game machine, a portable music player, or a digital camera.

The host 100 performs processing as a host of the system, and, for example, may be implemented by a processor such as a CPU and software (firmware) operating on the processor.

The information memory 110 is a memory that stores and holds instruction code information and/or waveform information, which will be described below, and, for example, may be implemented by a non-volatile memory (such as a flash memory) to and from which data can be written and deleted.

The image memory 120 (display memory or video memory) is a memory that stores data (display data) of images to be displayed on an electro-optical panel 230 and may be implemented by a RAM such as an SDRAM, for example.

The power supply circuit 150 supplies power required for driving the electro-optical panel 230 to the electro-optical apparatus 200 and may be implemented by a power supply control IC or a discrete circuit.

The electro-optical apparatus 200 (panel module) implements display operations by changing optical characteristics of electro-optical elements (such as electrophoretic elements, liquid crystal elements and EL elements) of the electro-optical panel 230 and may include a data driver 210, a scan driver 220, an electro-optical panel 230, a panel ID memory 240 and so on. The configuration of the electro-optical apparatus 200 is not limited thereto, but a part (such as a panel ID memory) of the components may be omitted, or other components may be added for different variations. The data driver 210 and scan driver 220 may be integrated into the electro-optical panel 230.

The electro-optical panel 230 (display panel) has a plurality of data lines (such as source lines), a plurality of scan lines (such as gate lines), and a plurality of pixels each of which is positioned at the intersection of a data line and a scan line. The data driver 210 and scan driver 220 drive data lines and scan lines of the electro-optical panel 230 to change the optical characteristics of the electro-optical elements in the pixel area for implementing a display operation. The electro-optical panel 230 may be, for example, an active matrix panel having a switch element such as a TFT and a TFD or may be a non-active matrix panel.

The panel ID memory 240 stores production information (such as production lot) and panel information on the electro-optical apparatus 200, as will be described below, and may be implemented by a non-volatile memory (such as an EEPROM) to and from which data can be written and deleted, for example.

The integrated circuit device 10 includes a host interface (I/F) 20, a control unit 30, a register unit 50, an information memory I/F 60, a panel I/F 70, and a work memory 80. The configuration of the integrated circuit device 10 is not limited thereto, but a part of the components (such as an information memory I/F and a panel I/F) may be omitted, or other components may be added for different variations.

The host I/F 20 performs interface processing to and from the host 100. For example, the host I/F 20 exchanges an interface signal such as a data signal, an address signal or a write/read signal with the host 100 to implement the interface to/from the host 100.

The control unit 30 performs control processing and may perform display control processing over the electro-optical apparatus 200, for example. The control unit 30 may perform control processing over the entire integrated circuit device 10, memory control processing over the image memory 120, control processing over the power supply circuit 150 and so on. The control unit 30 may be implemented by a gate array circuit or a processor.

The register unit 50 is a block containing registers. For example, the register unit 50 includes an information register 52 that provides information to the host 100. The register unit 50 may include a control register and/or a status register. The functions of the register unit 50 may be implemented by a RAM such as an SRAM or a flip-flop circuit, for example.

The information memory I/F 60 performs interface processing to and from the information memory 110. For example, the information memory I/F 60 exchanges an interface signal with the information memory 110 to implement interface to/from the information memory 110.

The panel I/F 70 (electro-optical apparatus interface in a broad sense) performs interface processing to and from the electro-optical apparatus 200 (panel ID memory). For example, the panel I/F 70 exchanges an interface signal with the electro-optical apparatus 200 to implement interface to/from the electro-optical apparatus 200.

The control unit 30 includes a command decoder 32, a sequence control section 34, a display control section 36, a memory control section 38, and a power supply control section 40. A part of the components may be omitted, or other components may be added for different variations.

The command decoder 32 performs decode processing on a command issued by the host 100 and interprets the command. The sequence control section 34 performs sequence control for operational control over the integrated circuit device 10. The display control section 36 performs display control over the electro-optical apparatus 200. For example, the display control section 36 generates a data signal and/or a control signal to be output to the data driver 210 and/or scan driver 220 in the electro-optical apparatus 200. The power supply control section 40 controls the power supply circuit 150 in the electro-optical apparatus 200. For example, the power supply control section 40 generates a power supply control signal and outputs it to the power supply circuit 150 to control power supply voltage to be supplied from the power supply circuit 150 to the electro-optical apparatus 200 and/or its supply timing.

According to this embodiment, the information register 52 stores instruction select information (instruction designation information) for selecting (or instructing) instruction code information. For example, the information register 52 stores the instruction select information obtained from the electro-optical apparatus 200 when the electronic equipment is produced and presents it to the host 100. More specifically, the panel I/F 70 (electro-optical apparatus interface) read from the electro-optical apparatus 200 and sets in the information register 52 the instruction select information stored in the panel ID memory 240 (memory in a broad sense) in the electro-optical apparatus 200 when the electronic equipment is produced. Alternatively, the stack identification information acquired on the basis of the set voltage of a pad for stack identification is set to the information register 52 as the instruction select information, as will be described below.

When an electronic equipment (such as an electronic book or portable information terminal having a panel module) including the electro-optical apparatus 200 is produced (or assembled), the instruction code information selected from a plurality of instruction code information pieces on the basis of the instruction select information stored in the information register 52 is loaded to the information memory 110. The control unit performs operational control over the integrated circuit device 10 on the basis of the command issued by the host 100 and the instruction code information read from the information memory 110 when the electronic equipment actually operates. For example, the control unit 30 performs sequence control over the integrated circuit device 10, memory control over the image memory 120, power supply control over the power supply circuit 150 or display control over the electro-optical apparatus 200.

More specifically, if the instruction code information selected on the basis of the instruction select information in the information register 52 is obtained through the host I/F 20 when the electronic equipment is produced, the information memory I/F 60 writes the obtained instruction code information to the information memory 110.

Then, the information memory I/F 60 reads instruction code information from the information memory 110 when the electronic equipment actually operates (or is in operation). The control unit 30 performs operational control over the integrated circuit device 10 on the basis of the command issued by the host 100 when the electronic equipment actually operates and the instruction code information read from the information memory 110.

The instruction code information here refers to information describing the instruction code included in a command issued by the host 100. For example, the host 100 issues a command for performing an operational control over the integrated circuit device 10. Then, the control unit 30 receives a command code and/or parameter from the host 100 through the host I/F 20 and performs operational control (such as display control over the electro-optical apparatus) corresponding to the issued command on the integrated circuit device 10. In this case, the detail instruction code included in the command issued by the host 100 is loaded as the instruction code information to the information memory 110 when the electronic equipment is produced, without receiving from the host 100. When the host 100 issues a command, a series of instruction codes included in the command is identified by the instruction code information. The series of instructions corresponding to the series of instruction codes is implemented to implement the operational control over the integrated circuit device 10. The instruction code refers to a code describing an instruction to, for example, write information (such as data and the address) to a control register in the register unit 50 or read information (such as data and the status) from the status register in the register unit 50.

According to this embodiment, the information register 52 may store wave selection information (wave instruction information) for selecting (or instructing) waveform information. For example, the information register 52 may store wave selection information acquired from the electro-optical apparatus 200 when the electronic equipment is produced and provide it to the host 100. More specifically, the panel I/F 70 (electro-optical apparatus interface) may read from the electro-optical apparatus 200 the wave selection information stored in the panel ID memory 240 (memory in a broad sense) in the electro-optical apparatus 200 when the electronic equipment is produced and set it to the information register 52.

When the electronic equipment is produced, the waveform information selected (instructed) by the wave selection information stored in the information register from a plurality of waveform information pieces is loaded to the information memory 110. When the electronic equipment actually operates (or is in operation), the control unit 30 performs the display control over the electro-optical apparatus 200 on the basis of the waveform information read from the information memory 110. More specifically, if the waveform information selected on the basis of the wave selection information in the information register 52 is acquired through the host I/F 20 when the electronic equipment is produced, the information memory I/F 60 writes the acquired waveform information to the information memory 110.

The information memory I/F 60 reads the waveform information from the information memory 110 when the electronic equipment actually operates (or is in operation). When the electronic equipment actually operates, the control unit 30 performs the display control over the electro-optical apparatus 200 on the basis of the waveform information read from the information memory 110.

The waveform information here refers to information defining a waveform of a drive signal for the electro-optical apparatus 200. For example, the data driver 210 for the electro-optical apparatus 200 supplies the drive signal (data signal) having the waveform corresponding to the image data stored in the image memory 120 to data lines of the electro-optical panel 230. The waveform information refers to the information defining timing or voltage of a waveform of the drive signal. For example, when a waveform spanning plurality of frames is used to change the gray-scale of a pixel from a first gray-scale to a second gray-scale, the waveform information refers to information that specifies the voltage to be applied to pixels of each frame of the waveform spanning the a plurality of frame.

For example, in an electrophoretic display device, the waveform of an optimum drive signal (drive signal for performing optimum display control) may depend on the production lot of the electro-optical apparatus 200 (panel module), for example. In this case, for example, waveform information defining the waveform of the optimum drive signal for the electro-optical apparatus 200 under display control by the integrated circuit device 10 is selected and loaded to the information memory 110 when the electronic equipment is produced. When the electronic equipment actually operates, the loaded waveform information is used to perform display control over the electro-optical apparatus 200.

Next, operations of this embodiment will be described with reference to FIGS. 10 and 11.

Figure 10:
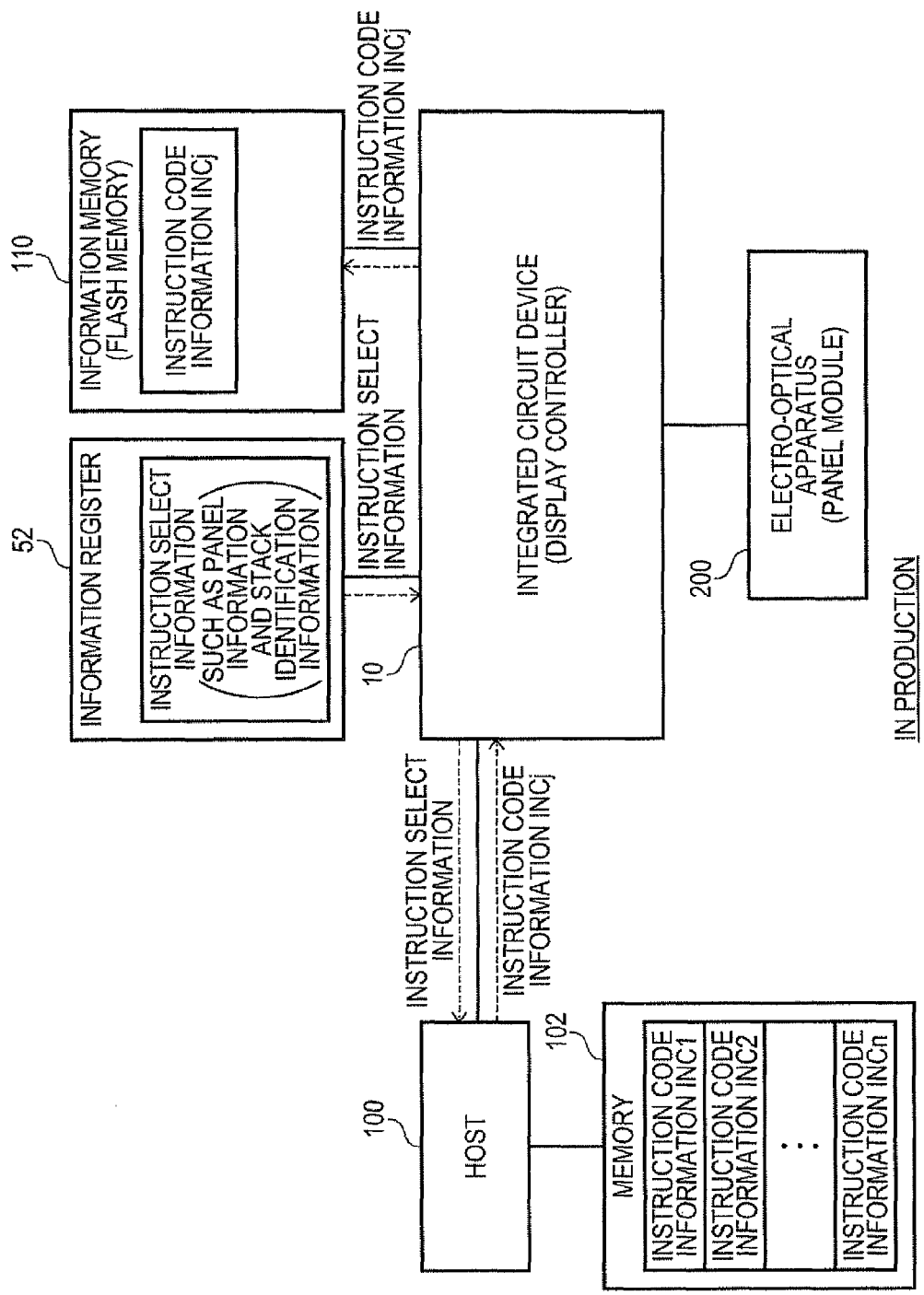
FIG. 10 is an explanatory operation diagram on the integrated circuit device.

As illustrated in FIG. 10, the memory 102 accessible by the host 100 stores a plurality of instruction code information pieces INC1 to INCn. The memory 102 may only be required to be accessible by the host 100, and may be a memory provided in electronic equipment or may be an external memory (memory for a PC for production). The host (such as a PC) when the electronic equipment is produced may be different from the host (such as a CPU) when the electronic equipment actually operates. The processing of loading instruction code information or waveform information to the information memory 110 may be implemented by the host 100, for example, directly writing the information to the information memory 110 without through the integrated circuit device 10.

As illustrated in FIG. 10, the information register 52 stores instruction select information.

The instruction select information here refers to information for selecting the instruction code information to be loaded to the information memory 110 from a plurality of instruction code information pieces INC1 to INCn. The instruction select information may be panel information, stack identification information or the like, for example. The panel information refers to information for specifying the type or size (number of pixels) of the panel of the electro-optical apparatus 200. The stack identification information refers to information for identifying either the stack mode in which the chip of the image memory 120 is stacked on the integrated circuit device 10 or the non-stack mode without being stacked, as will be described below.

The host 100 selects the instruction code information piece INCj corresponding to the instruction select information from the instruction code information pieces INC1 to INCn on the basis of the instruction select information set in the information register 52. For example, when the instruction select information is panel information, the host 100 selects the instruction code information corresponding to the type or size of the panel identified by the panel information from the instruction code information pieces INC1 to INCn. When the instruction select information is stack identification information and it is in the stack mode, the host 100 selects the instruction code information for the stack mode from the instruction code information pieces INC1 to INCn. On the other hand, when it is in the non-stack mode, the host 100 selects the instruction code information for the non-stack mode. The selected instruction code information INCj is loaded and saved in the non-volatile information memory 110.

Figure 11:
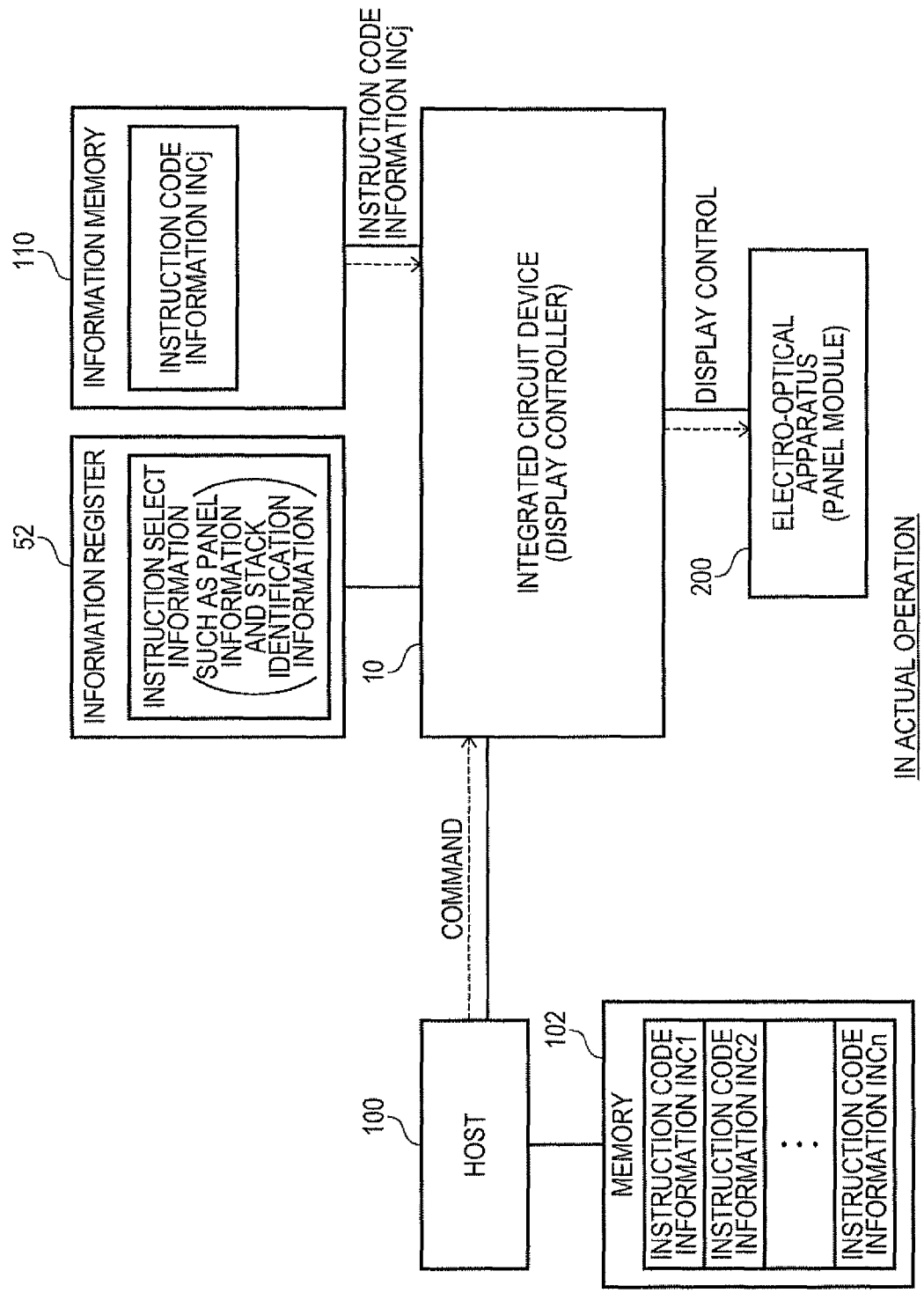
FIG. 11 is an explanatory operation diagram on the integrated circuit device.

As illustrated in FIG. 11, if the host 100 issues a command when the electronic equipment actually operates for when the electronic equipment is actually used by a user), operational control is performed over the integrated circuit device 10 on the basis of the issued command and the instruction code information piece INCj read from the information memory 110. In other words, the series of a plurality of instructions corresponding to the command is performed.

As described above, according to this embodiment, the instruction select information for selecting instruction code information is provided to the host 100 through the information register 52. The instruction code information corresponding to the instruction select information is selected by the host 100 and is loaded to the information memory 110 when the electronic equipment is produced. When the electronic equipment actually operates, operational control is performed over the integrated circuit device 10 on the basis of the loaded instruction code information and a command from the host 100.

For example, whether the integrated circuit device 10 is set in the stack mode in which the image memory is stacked or the non-stack mode in which the image memory is not stacked is difficult to determine when the electronic equipment is produced. For example, in the non-stack mode and when an external image memory is used, the image memory stacked on the integrated circuit device 10 may be different from the external image memory in bit widths of data and/or addresses. When the different bit widths of data and/or addresses may differentiate the descriptions of the instruction code, and the different instruction code information must be used. Similarly, when the type or size of the panel is different, the descriptions of the instruction code included in a command for display control may differ.

According to this embodiment, since the instruction select information for selecting instruction code information is set in the information register 52, the host 100 may read the instruction select information and automatically download the instruction code information to the information memory 110. For example, when the integrated circuit device 10 is in the stack mode, the instruction code information for the stack mode is automatically loaded to the information memory 110. When the integrated circuit device 10 is in the non-stack mode, the instruction code information for the non-stack mode is automatically loaded. The instruction code information in accordance with the type or size of panel is automatically loaded to the information memory 110. Therefore, the efficiency of production can be improved more than manually selecting and loading instruction code information when the electronic equipment is produced. As a result, the throughput of the production can be improved, and the electronic equipment can be mass-produced more easily.

5. Instruction Code Information

Next, examples of the instruction code information will be described.

For example, the command issued by the host 100 is implemented by sequentially executing a plurality of instructions for controlling operations by the integrated circuit device 10. For example, referring to FIG. 12, the command CMA is implemented by sequentially executing the instructions INSA1, INSA2, INSA3 . . . . The command CMB is implemented by sequentially executing the instructions INSB1, INSB2, INSB3 . . . . According to this embodiment, in this way, a column of code of the instruction included in a command is prepared as the instruction code information.

For example, FIG. 13 illustrates examples of commands to be issued by the host 100. For example, RUN_SYS, STBY, and SLP are commands for shifting the integrated circuit device 10 to a run mode (normal operation mode), a standby mode, and a sleep mode, respectively. INIT_SYS_RUN is a command for shifting the integrated circuit device 10 to the run mode after initialization. INIT_DSPE_CFG and INIT_DSPE_TMG are commands for initializing a display engine (display control section) and display timing, respectively.

RD_REG is a read command for a register. More specifically, RD_REG is a command for setting the data read from the address designated by a first parameter to a second parameter. WD_REG is a write command for a register. More specifically, WD_REG is a command for writing the data designated by the first parameter to the address designated by the second parameter.

BST_RD_SDR and BST_WR_SDR are commands for instructing a burst reading operation and a burst writing operation from/to the image memory 120 (SDRAM). These commands allow the host 100 to read image data from the image memory 120 and write image data to the image memory 120.

LD_IMG and LD_IMG_AREA are commands for instructing a full frame memory load operation and an area frame memory load operation. With these commands, the image corresponding to the image data written to the image memory 120 can be displayed on the electro-optical panel 230.

RD_WFM_INFO is a command instructing the display engine (display control section) to read waveform information. UPD_GDRV_CLR is a command to be used for clearing an undefined state of the scan driver (gate driver). WAIT_DSPE_TRG is a command instructing to wait for the completion of an operation by the display engine.

These commands can be implemented by executing a series of instruction instructing to write a register value to a register and read a register value in the register unit 50.

For example, when the command RUN_SYS is issued by the host 100, a disable instruction for the power-down mode of the PLL, a PLL lock wait instruction, a disable instruction for the power-save mode, a start instruction for a power ON sequence, a self-refresh operation finish instruction for the image memory 120, and an instruction to set the run mode status to the status register are executed through the registers in the register unit 50.

When the command INIT_DSPE_CFG is issued by the host 100, instructions for setting a line data length (horizontal size), setting a frame data length (perpendicular size), setting the data driver 210, and setting the scan driver 220 are executed through the registers in the register unit 50.

The instruction code information contains code of a series of instructions configuring those commands. In other words, the instruction code information describes columns of code of instructions for performing instruction/setting to the registers in the register unit 50.

For example, in order to execute the command RUN_SYS to shift the integrated circuit device 10 to the run mode, the host 100 may be configured to issue all instructions of a disable instruction for the power-down mode of the PLL, a PLL lock wait instruction, a disable instruction for the power-save mode. However, in this case, large processing load may be imposed on the host 100.

According to this embodiment, the host 100 may be configured to only issue the commands RUN_SYS and INIT_DSPE_CFG (its command code and parameters), and a series of instructions configuring the commands may be described in the instruction code information. Thus, the host 100 may only be required to issue one command to execute a series of instructions configuring the command, which can reduce the processing load on the host 100.

In this case, the descriptions of the instructions configuring a command may vary in accordance with the type or size of the panel. For that, according to this embodiment, as illustrated in FIG. 10, when the electronic equipment to which the integrated circuit device 10 and electro-optical apparatus 200 are to be attached is produced, the instruction code information corresponding to the type or size of the panel is selected from a plurality of instruction code information and is loaded to the information memory 110. Thus, when the electronic equipment actually operates, the instruction code information matched with the type or size of the panel can be read from the information memory 110 so that the operations by the integrated circuit device 10 can be controlled.

6. Signal Waveform

Next, there will be described signal waveform examples of a host interface, an information memory interface, a panel interface and a signal waveform example of a signal for display control.

First of all, details of the host interface will be described with reference to FIGS. 14A to 14C.

Figure 14A:
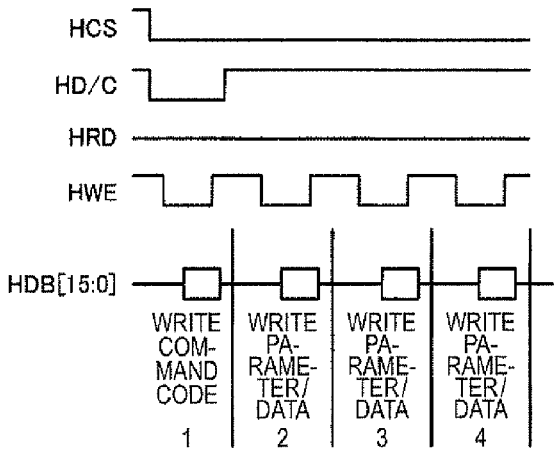
FIGS. 14A to 14C are explanatory diagrams on host interface.
Figure 14B:
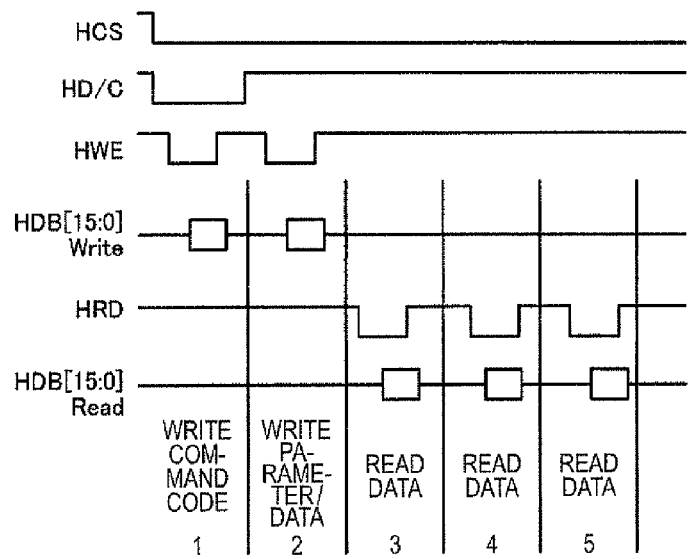

In FIGS. 14A and 14B, HCS is a chip select signal, and HD/C is a command/parameter (data) identification signal. HRD and HWE are a read enable signal and a write enable signal, and HDB [15:0] is a data signal.

FIG. 14A is a signal waveform diagram on a command mode operation for writing a parameter (data). In FIG. 14A, from the signal HD/C, the command phase and parameter (data) phase are identified. In the command phase, the code of the command is written. In the parameter (data) phase, the parameter (data) corresponding to the command is written.

FIG. 14B is a signal waveform diagram on a command mode operation for reading data from a register. Also in FIG. 14B, from the signal HD/C, the command phase and parameter (data) phase are identified. In the command phase, the code of the command is written. In the subsequent parameter phase, a parameter designating the address of the register, for example, is written. After that, data is read from the register.

Figure 14C:
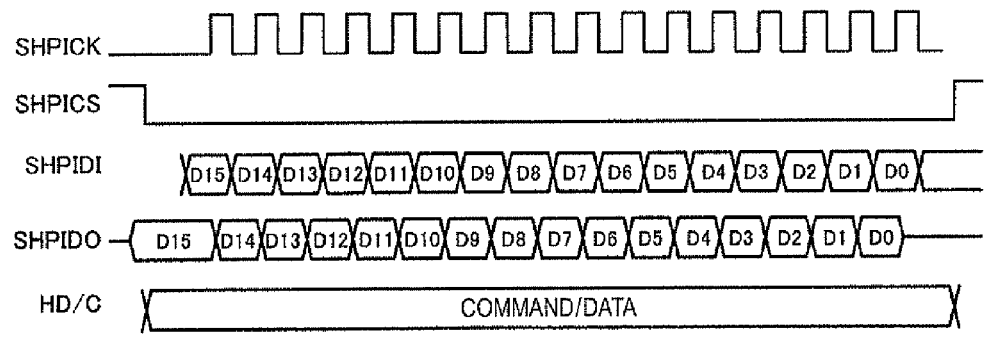

The host interface is not limited to a parallel interface as illustrated in FIG. 14A and FIG. 14B but may be a serial interface as illustrated in FIG. 14C. In FIG. 14C, the serial host interface can be implemented with a clock signal SHPICK, a chip select signal SHPICS, a serial input data signal SHPIDI, a serial output data signal SHPIDO, and a command/parameter (data) identification signal HD/C.

Next, details of the information memory interface and panel memory interface will be described with reference to FIGS. 15A to 15D.

Figure 15A:
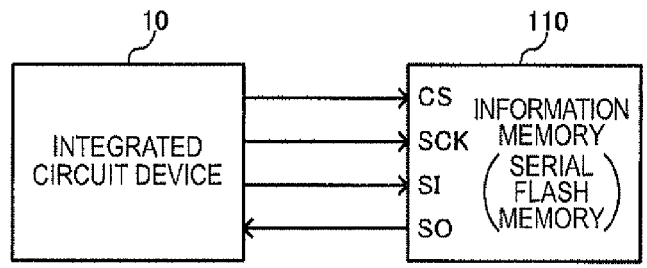
FIGS. 15A to 15D are explanatory diagrams on information memory interface and panel interface.
Figure 15B:
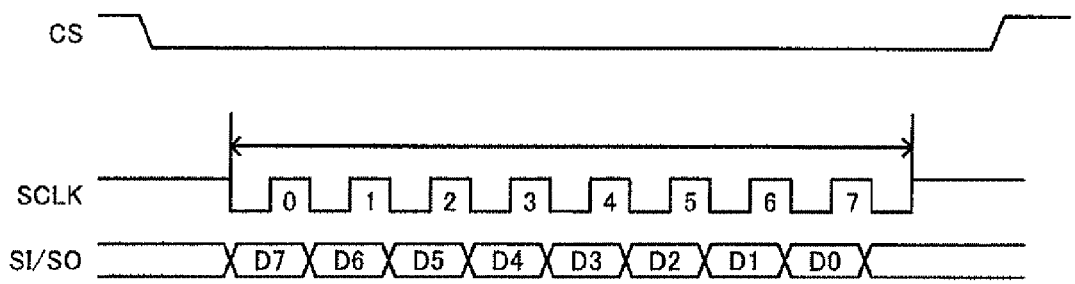

FIG. 15A illustrates an example in which the information memory 110 is a serial flash memory. In this case, the information memory interface may be implemented with a chip select signal CS, clock signal SCLK, serial input data signal SI, and a serial output data signal SO. FIG. 15B illustrates waveform examples of those signals. After the chip select signal CS becomes active (or has L level), the serial input data signal SI and serial output data signal SO are input and output in synchronism with the clock signal SCLK.

Figure 15C:
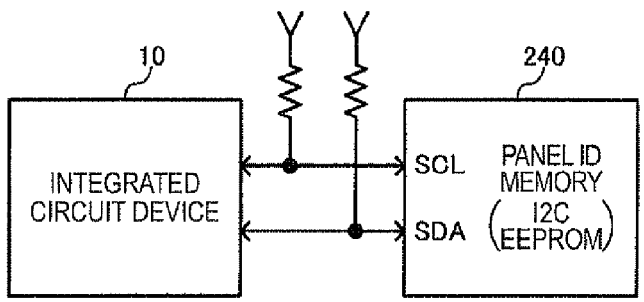

FIG. 15C is an example in which the panel ID memory 240 is an EEPROM compliant with I2C protocol. In this case, the panel interface may be implemented by signal lines for the clock signal SCL and serial data signal SDA. Those SCL and SDA signal lines are bidirectional signal lines (bidirectional bus) and are pulled up by a pull-up register. According to I2C, a plurality of slaves may be connected to one master, and each device has its own address. The data to be transferred over the serial data signal SDA contain the address.

Figure 15D:
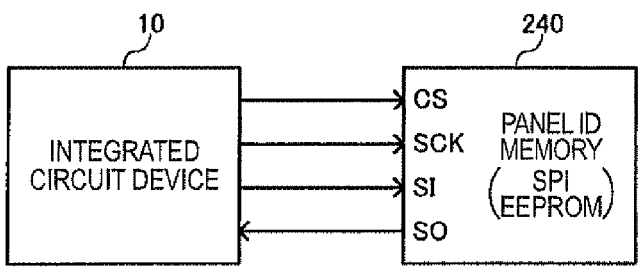

FIG. 15D illustrates an example in which the panel ID memory 240 is an EEPROM with a 4-wire system serial interface (SPI). In this case, the panel interface may be implemented with a chip select signal CS, a clock signal SCK, a serial input data signal SI, and a serial output data signal SO.

The host interface, information memory interface, and panel interface are not limited to the interfaces illustrated in FIGS. 14A to 15D, but may be any of various interfaces in accordance with the host, information memory, and panel ID memory, for example.

Next, a signal for display control will be described which is output from the pad group PG3 in FIG. 7.

Figure 16A:
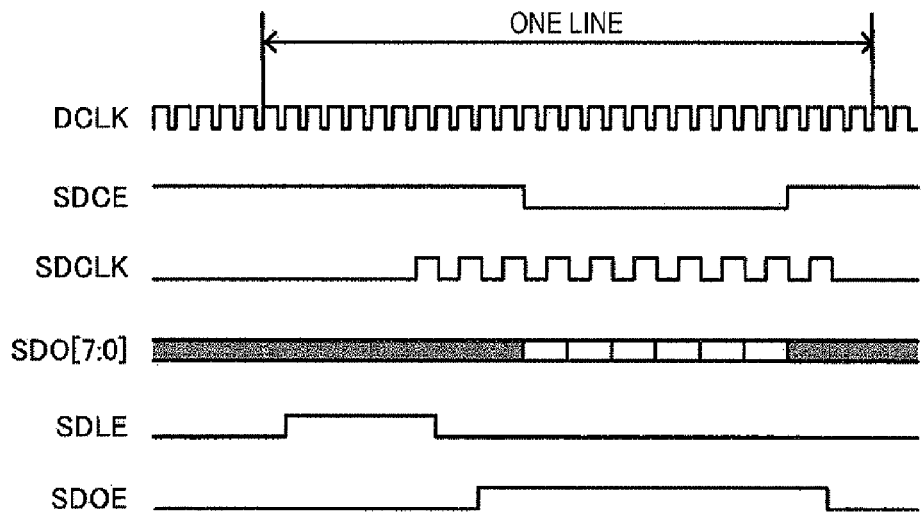
FIGS. 16A and 16B illustrate waveform examples of signals for display control.

FIG. 16A is waveform examples of signals for display control to be supplied to the data driver 210. DCLK is a dot clock signal that is an internal signal in the integrated circuit device 10. SDCE is a chip enable signal for the data driver 210, and SDCLK and SDO[7:0] are a clock signal and data signal to be supplied to the data driver 210. SDLE is a latch enable signal for the data driver 210, and SDOE is an output enable signal for the data driver 210.

In FIG. 16A, when the signal SDLE becomes non-active (L level) and the signal SDOE then becomes active (H level) and the signal SDCE becomes active (L level), the data signal SDO [7:0] is output in synchronism with the clock signal SDCLK.

Figure 16B:
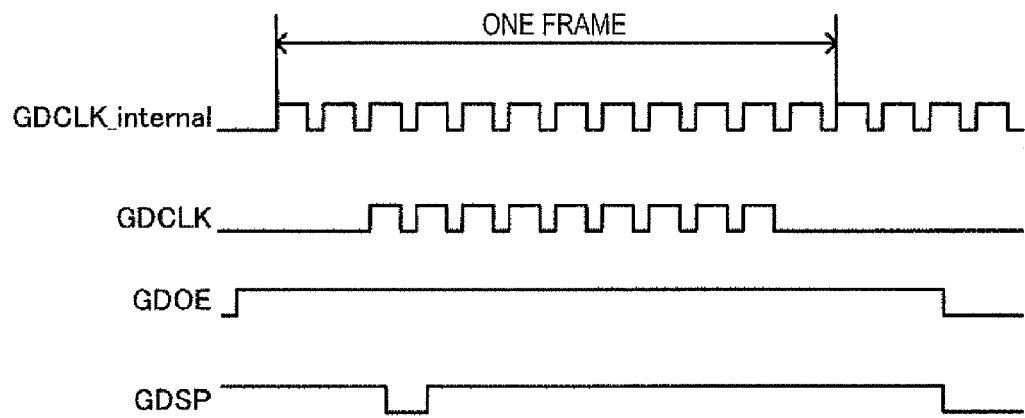

FIG. 16B is waveform examples of signals for display control to be supplied to the scan driver 220. GDCLK_internal is an internal signal for a clock signal for the scan driver. GDCLK is a clock signal to be supplied to the scan driver 220. GDOE is an output enable signal for the scan driver 220, and GDSP is a start pulse signal for scanning by the scan driver 220.

In FIG. 16B, when the signal GDOE becomes active (H level) and the signal GDSP then becomes active (L level), the scan driver 220 starts scanning.

The pad group PG3 in FIG. 7 outputs a data signal and control signal for display control as illustrated in FIGS. 16A and 16B.

The signals for display control to be input/output to/from the pad groups PG1, PG2, and PG3 are not limited to the signals illustrated in FIGS. 16A and 16B but may be any signals of various waveforms in accordance with the image memory and electro-optical apparatus.

7. Stack Mode/Non-Stack Mode

Figure 17A:
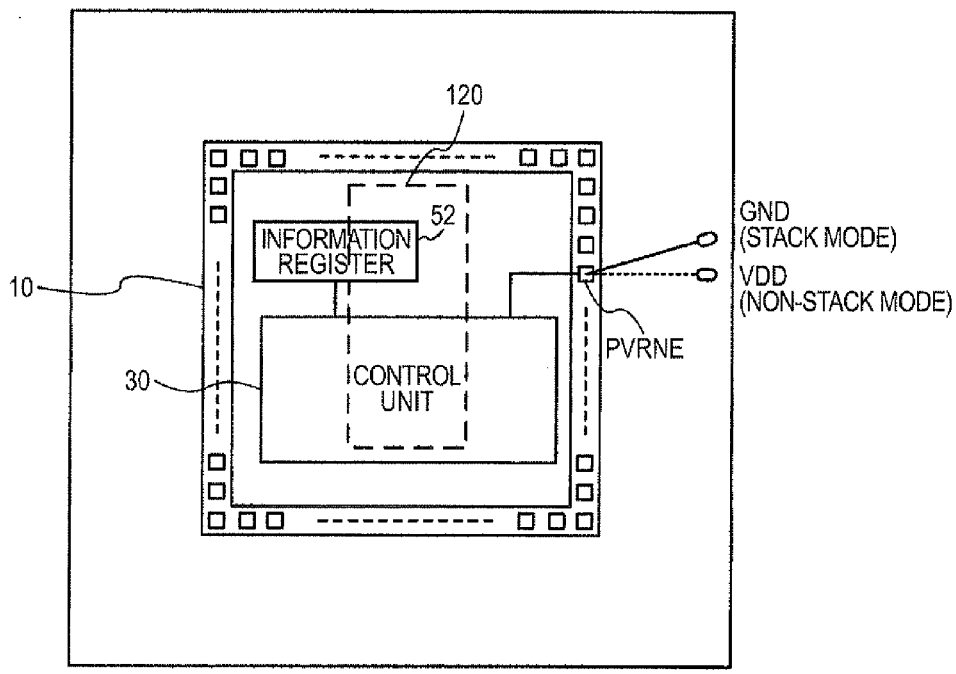
FIGS. 17A and 17B are explanatory diagrams on method of loading instruction code information on the basis of stack identification information.

The integrated circuit device 10 of this embodiment has the stack mode and the non-stack mode. As illustrated in FIG. 17A, the stack mode (stacked state) refers to the mode (state) in which the chip of the image memory 120 storing image data is stacked on the integrated circuit device 10 (display controller chip). In other words, two IC chips (image memory and display controller) produced by different production processes are packaged. The non-stack mode (non-stacked state) refers to a mode (state) in which the chip of the image memory 120 is not stacked on the integrated circuit device.

In the stack mode, the memory pads (electrodes) of the image memory 120 are internally wired with the pads (electrodes) of the integrated circuit device 10 by bonding. Thus, image data from the host 100, for example, can be stored in the image memory 120 functioning as a VRAM without using an external image memory.

On the other hand, in the non-stack mode, an external image memory (externally provided chip of an image memory) is used instead of the image memory 120. The address signals, data signals, control signals and so on from the pads of the integrated circuit device 10 are used to access the external image memory and write/read image data.

In order to support both of the stack mode and the non-stack mode and reduce the costs, the chips of the integrated circuit device 10 are desirably produced by using the same mask data. In other words, when the integrated circuit device for the stack mode and the integrated circuit device for the non-stack mode are different IC chips that are produced with different mask data, the costs may increase and/or the product management may become more complicated.

Referring to FIG. 17A, switching between the stack mode and the non-stack mode is implemented with bonding wiring on the pads of the integrated circuit device 10. More specifically, in FIG. 17A, stack identification pads PVRNE are provided as the pads of the integrated circuit device 10. The stack identification pads PVRNE are set to GND (first power supply voltage in a broad sense) in the stack mode and are set to VDD (second power supply voltage) in the non-stack mode. More specifically, in the stack mode, the bonding wire set to the potential at GND (bonding wire connected to the GND terminal of the package) is connected to the stack identification pads PVRNE when the IC chip is packaged. On the other hand, in the non-stack mode, the bonding wire set to the potential at VDD (bonding wire connected to the VDD terminal of the package) is connected to the stack identification pads PVRNE when the IC chip is packaged.

Figure 17B:
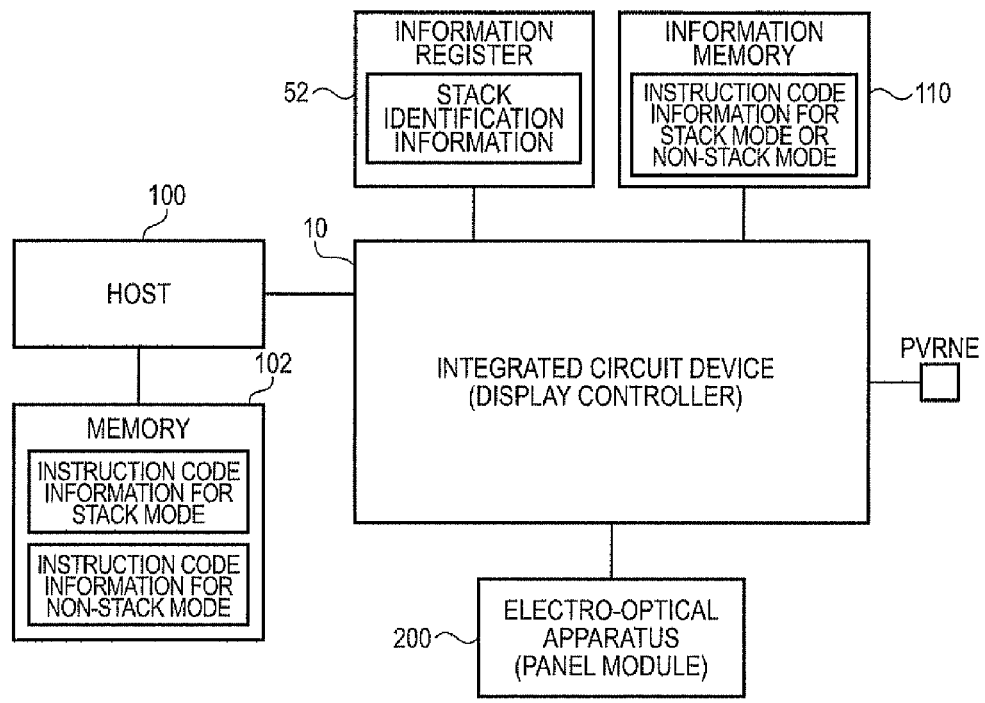

As illustrated in FIG. 17B, the information register 52 stores, as the instruction select information, stack identification information for identifying either stack mode in which the chip of the image memory 120 is stacked on the integrated circuit device or non-stack mode without being stacked. For example, the information register 52 stores stack identification information set on the basis of the voltage of the stack identification pads PVRNE in FIG. 17A. More specifically, the information register 52 stores a stack identification bit as the stack identification information. The stack identification bit is set to a first logic level (such as "0") when the stack identification pads PVRNE are set to GND and set to a second logic level (such as "1") when PVRNE is set to VDD.

If the stack mode is set with the stack identification pads PVRNE, for example, the instruction code information for the stack mode out of a plurality of instruction code information pieces is loaded to the information memory 110 when the electronic equipment is produced. When the electronic equipment actually operates, operational control is performed over the integrated circuit device 10 on the basis of the command issued by the host 100 and the instruction code information for the stack mode.

On the other hand, if the non-stack mode is set, the instruction code information for the non-stack mode out of a plurality of instruction code information pieces is loaded to the information memory 110 when the electronic equipment is produced. When the electronic equipment actually operates, operational control is performed over the integrated circuit device 10 on the basis of the command issued by the host 100 and the instruction code information for the non-stack mode.

For example, the integrated circuit device set to the stack mode and the integrated circuit device set to the non-stack mode are provided to a user as different products. A user requesting the use of a memory having a larger capacity than the image memory to be stacked is provided with the product set to the non-stack mode. Then, an external image memory is used as the VRAM. The image memory to be stacked and an external image memory are different in the bit width of data and/or bit width of addresses. For example, the image memory to be stacked may be provided for data of 16 bit width and an address of 11 bit width. On the other hand, the external image memory may be provided for data of 32 bit width and an address of 13 bit width, for example.

When the bit widths of data and/or addresses (bit count) differ, the descriptions of the instruction code configuring commands may differ. Thus, in the stack mode, the instruction code information for the stack mode describing the instruction code matched with the image memory to be stacked is loaded to the information memory 110. On the other hand, in the non-stack mode, the instruction code information for the non-stack mode describing the instruction code matched with the external image memory is loaded to the information memory 110.

On the other hand, as illustrated in FIG. 17A, switching is performed between the stack mode and the non-stack mode by bonding to the stack identification pads PVRNE, distinguishing whether the integrated circuit device 10 is in the stack mode or the non-stack mode is difficult from the appearance of the package.

According to this embodiment, the information register 52 stores the stack identification information set on the basis of the voltage of the stack identification pads PVRNE. Thus, the host 100 can read the stack identification information in the information register 52 through the host I/F 20 so that whether the integrated circuit device 10 is in the stack mode or the non-stack mode can be identified. In the stack mode, the instruction code information for the stack mode is loaded to the information memory 110. In the non-stack mode, the instruction code information for the non-stack mode is loaded to the information memory 110.

Hence, when the electronic equipment is produced, whether the integrated circuit device 10 is a product in the stack mode or non-stack mode can be automatically identified on the basis of the stack identification information in the information register 52. Then, the instruction code information corresponding to each mode can be loaded to the information memory 110. This can improve the efficiency of production more than the method of manually selecting and loading the instruction code information when the electronic equipment is produced. As a result, the throughput of the production and others can be improved, and the electronic equipment can be mass-produced more easily.

Having described this embodiment in detail above, those skilled in the art will easily understand that many variations are possible without substantially departing from the novel matters and effects of the invention. Thus, such variation examples are all included in the scope of the invention. For example, the terms (such as panel I/F and panel ID memory) used at least once herein or in the appended drawings together with different terms (such as an electro-optical apparatus interface and memory) which are synonymous in a broad sense or synonymous may be replaced by different terms in any part hereof or the accompanying drawings. The configurations and operations of the integrated circuit apparatus, electronic equipment and so on are not limited to those described according to the embodiment, but different variations are possible.

What is claimed is:

1. A device comprising:
   a memory with a first memory pad to an ith memory pad and a jth memory pad to a kth ($1<i<j<k$) memory pad;
   an integrated circuit device, wherein the memory is stacked on the integrated circuit device, the integrated circuit device comprising:
      a first pad to an ith pad connected to the first memory pad to the ith memory pad;
      a jth pad to a kth pad connected to the jth memory pad to the kth ($1<i<j<k$) memory pad; and
      at least one pad arranged between the ith pad and the jth pad, wherein the at least one pad is not connected to a memory pad of the memory and serves as a pad for inputting or outputting a signal between an external device and the integrated circuit device, and
   a power supply pad that is not connected to a substrate that supports the first pad to the ith pad, the jth pad to the kth pad and the at least one pad but is instead arranged on the memory between the ith memory pad and the jth memory pad, wherein the power supply pad is not connected to the first pad to the ith pad, the jth pad to the kth pad and the at least one pad.

2. The device according to claim 1, further comprising a control unit that performs read-control and write-control over data in the memory, wherein
   the control unit performs read-control and write-control over data of the memory in a stack mode in which a chip of the memory is stacked on the integrated circuit device and performs read-control and write-control over data of an external memory in a non-stack mode in which the chip of the memory is not stacked on the integrated circuit device; and
   the at least one pad arranged between the ith pad and the jth pad serves as a non-stack mode pad for outputting or inputting at least one of a data signal, an address signal and a control signal from or to the external memory in the non-stack mode.

3. The device according to claim 1, wherein no memory pad is arranged between the ith memory pad and the jth memory pad.

4. The device according to claim 3, wherein the relation: LDS≥2LP, where LDS is a distance between the ith memory pad and the jth memory pad and LP is the arrangement pitch between memory pads, is satisfied.

5. The device according to claim 1, wherein the first memory pad to the ith memory pad and the jth memory pad to the kth memory pad are included in a first memory pad group arranged along a first chip side of the chip of the memory or included in a second memory pad group arranged along a third chip side on the opposite of the first chip side of the chip of the memory; and
   the first pad to the ith pad and the jth pad to the kth pad are included in a first pad group arranged along a first side of the integrated circuit device or included in a second pad group arranged along a third side on the opposite side of the first side of the integrated circuit device.

6. The device according to claim 5, wherein
   the memory is an image memory that stores image data; and
   a control unit performs display control over an electro-optical apparatus on the basis of image data stored in the image memory.

7. The device according to claim 6, comprising:
   the first pad group arranged along the first side of the integrated circuit device and connected to the first memory pad group arranged along the first chip side of the chip of the image memory;
   the second pad group arranged along the third side of integrated circuit device and connected to the second memory pad group arranged along the third chip side of the chip of the image memory; and
   a third pad group that receives the output of a data signal and a control signal for display control over the electro-optical apparatus and are arranged along a second side crossing the first side and the third side of the integrated circuit device.

8. The device according to claim 7, further comprising a fourth pad group for host interface, wherein
   the fourth pad group is arranged along a fourth side on the opposite side of the second side of the integrated circuit device.

9. The device according to claim 7, further comprising a fifth pad group that receives the output of a signal for control over a power supply circuit in the electro-optical apparatus, wherein
   the fifth pad group is arranged along the second side of the integrated circuit device.

10. The device according to claim 7, wherein
    the control unit performs display control over the electro-optical apparatus on the basis of the image data from the image memory in the stack mode in which the chip of the image memory is stacked on the integrated circuit device and performs display control over the electro-optical apparatus on the basis of external image data from an external image memory in the non-stack mode in which the chip of the image memory is not stacked on the integrated circuit device.

11. The device according to claim 10, further comprising a stack identification pad that is set to a first power supply voltage in the stack mode with a bonding wire and is set to a second power supply voltage in the non-stack mode with the bonding wire.

12. The device according to claim 7, further comprising:
    a host interface that performs interface processing to/from a host; and
    an information register that provides information to the host,
    wherein
    the information register stores instruction select information for selecting instruction code information describing instruction code, the instruction code configuring a command issued by the host;
    the instruction code information selected on the basis of the instruction select information stored in the information register from a plurality of instruction code information pieces is loaded to an information memory when electronic equipment including the electro-optical apparatus is utilized; and
    the control unit performs operational control over the integrated circuit device on the basis of the command issued by the host and the instruction code information read from the information memory when the electronic equipment operates.

13. The device according to claim 12, wherein
    the information register stores stack identification information for identifying, as the instruction select information, the stack mode in which the chip of the image memory that stores image data is stacked on the integrated circuit device or the non-stack mode in which the chip of the image memory is not stacked on the integrated circuit device.

14. The device according to claim 13, wherein in the stack mode, when the electronic equipment is utilized, instruction code information for the stack mode from the plurality of instruction code information pieces is loaded to the information memory, and, when the electronic equipment operates, operational control is performed over the integrated circuit device on the basis of the command issued by the host and the instruction code information for the stack mode; and in the non-stack mode, when the electronic equipment is utilized, instruction code information for the non-stack mode from the plurality of instruction code information pieces is loaded to the information memory, and, when the electronic equipment operates, operational control is performed over the integrated circuit device on the basis of the command issued by the host and the instruction code information for the non-stack mode.

15. The device according to claim 13, further comprising a stack identification pad that is set to a first power supply voltage with a bonding wire in the stack mode and is set to a second power supply voltage with a bonding wire in the non-stack mode, wherein the information register stores the stack identification information set on the basis of the voltage of the pad for stack identification.

16. Electronic equipment comprising the device according to claim 1.

* * * * *